US012652960B2

(12) United States Patent
Despesse et al.

(10) Patent No.: US 12,652,960 B2
(45) Date of Patent: Jun. 9, 2026

(54) ELECTRONIC DEVICE AND METHOD FOR DRIVING WITHOUT COMMON MODE AN ELECTRIC ENERGY CONVERTER COMPRISING TWO PIEZOELECTRIC ELEMENTS, RELATED ELECTRONIC SYSTEM FOR ELECTRIC ENERGY CONVERSION

(71) Applicant: Commissariat à l'énergie atomique et aux énergies alternatives, Paris (FR)

(72) Inventors: Ghislain Despesse, Grenoble Cedex (FR); Mustapha Touhami, Grenoble Cedex (FR); Valentin Breton, Grenoble Cedex (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 863 days.

(21) Appl. No.: 18/059,743

(22) Filed: Nov. 29, 2022

(65) Prior Publication Data

US 2023/0180617 A1 Jun. 8, 2023

(30) Foreign Application Priority Data

Dec. 3, 2021 (FR) ..................................... 21 12925

(51) Int. Cl.
*H10N 30/80* (2023.01)
*H02M 1/00* (2006.01)
(52) U.S. Cl.
CPC ........ *H10N 30/802* (2023.02); *H02M 1/0058* (2021.05); *H02M 1/009* (2021.05)
(58) Field of Classification Search
None
See application file for complete search history.

(56) References Cited

U.S. PATENT DOCUMENTS

2013/0169198 A1 7/2013 Wei et al.
2017/0012556 A1* 1/2017 Jeong ................ H02M 3/33573
(Continued)

FOREIGN PATENT DOCUMENTS

CN 102522492 A * 6/2012
FR 3 086 471 A1 3/2020
(Continued)

OTHER PUBLICATIONS

French Preliminary Search Report Issued Jul. 4, 2022, in French Application 21 12925 filed on Dec. 3, 2021(with English Translation of Categories of Cited Documents), 3 pages.
(Continued)

*Primary Examiner* — William J Klimowicz
(74) *Attorney, Agent, or Firm* — Oblon, McClelland, Maier & Neustadt, L.L.P.

(57) ABSTRACT

An electronic device is provided for controlling a converter from an input voltage to at least one output voltage, including a first bridge comprising two first switching branches, each between two terminals of the input voltage and comprising two first switches connected at a first midpoint. At least one second bridge is further included having two second switching branches, each between two terminals of the output voltage and including two second switches connected at a second midpoint. The electronic device further includes at least one pair of first and second piezoelectric assemblies, each connected between respective first and second midpoints, distinct from one piezoelectric assembly to the other.

17 Claims, 9 Drawing Sheets

(56)                     References Cited

U.S. PATENT DOCUMENTS

| | | | | |
|---|---|---|---|---|
| 2019/0109580 A1* | 4/2019 | Bondar | ............... | H02M 3/335 |
| 2020/0098968 A1* | 3/2020 | Despesse | ............ | H10N 30/804 |
| 2020/0099297 A1* | 3/2020 | Despesse | ......... | H02M 3/33584 |
| 2021/0194386 A1* | 6/2021 | Despesse | ............. | H02M 7/797 |
| 2021/0399638 A1* | 12/2021 | Xia | .......................... | H03H 9/17 |
| 2022/0345037 A1* | 10/2022 | Despesse | ............. | H02M 3/155 |
| 2023/0026677 A1* | 1/2023 | Despesse | .............. | H10N 30/40 |
| 2023/0180615 A1* | 6/2023 | Despesse | ......... | H02M 3/33573 |
| | | | | 363/13 |
| 2023/0180616 A1* | 6/2023 | Despesse | ........... | H02M 1/0058 |
| | | | | 310/318 |
| 2023/0200248 A1* | 6/2023 | Despesse | ......... | H02M 3/33569 |
| | | | | 310/316.01 |

FOREIGN PATENT DOCUMENTS

| | | | | |
|---|---|---|---|---|
| FR | 3 086 472 A1 | 3/2020 | | |
| KR | 20170006736 A | * 1/2017 | ............. | H02M 1/12 |

OTHER PUBLICATIONS

Pollet, "Convertisseurs DC-DC Piezoélectrique Avec Stockage Provisoire D'énergie Sous Forme Mécanique", URL:https://tel. archives-ouvertes.fr/tel-02415837/document, Nov. 15, 2019, 169 Pages.

* cited by examiner

ELECTRONIC DEVICE AND METHOD FOR DRIVING WITHOUT COMMON MODE AN ELECTRIC ENERGY CONVERTER COMPRISING TWO PIEZOELECTRIC ELEMENTS, RELATED ELECTRONIC SYSTEM FOR ELECTRIC ENERGY CONVERSION

CROSS-REFERENCE TO RELATED APPLICATIONS

This application is a U.S. non-provisional application claiming the benefit of French Application No. 21 12925, filed on Dec. 3, 2021, which is incorporated herein by reference in its entirety.

FIELD

The present invention relates to an electronic device for controlling an electrical energy converter capable of converting an input voltage into at least one output voltage.

The converter comprises a first switching bridge comprising two first switching branches, each first switching branch being connected between two input voltage supply terminals and comprising at least two first switches connected in series and linked together at a first midpoint; at least one second switching bridge comprising two second switching branches, each second switching branch being connected between two output voltage supply terminals and comprising at least two second switches connected in series and linked together at a second midpoint; and at least one pair of first and second piezoelectric assemblies, each piezoelectric assembly comprising at least one piezoelectric element and being connected between respective first and second midpoints, the midpoints between which the piezoelectric assemblies are connected being distinct from one piezoelectric assembly to the other.

The electronic control device is configured to command, during a respective resonance cycle of the piezoelectric assemblies, a switching of each of the switches to alternate phases at substantially constant voltage across the piezoelectric assemblies and phases at substantially constant load across said piezoelectric assemblies.

The invention also relates to an electronic system for electrical energy conversion comprising such an electrical energy converter and an electronic device for controlling said converter.

The invention also relates to a method for controlling such an electrical energy converter, the method being implemented by such an electronic control device.

The invention relates to the field of electronic systems for converting electrical energy, in particular those with a piezoelectric element, especially systems for converting into direct electrical current, i.e. DC-DC conversion systems, and also AC-DC conversion systems.

BACKGROUND

An electrical energy converter of the aforementioned type is known from the documents FR 3 086 471 A1 and FR 3 086 472 A1, as well as from the thesis manuscript "Convertisseurs DC-DC piézoélectrique avec stockage provisoire d'énergie sous forme mécanique" (translation: "piezoelectric DC-DC converters with temporary mechanical energy storage") by Benjamin Pollet, and can be seen in FIG. 20 of the documents FR 3 086 471 A1 and FR 3 086 472 A1, and in FIG. 4.15 of the aforementioned thesis manuscript.

As mentioned in FR 3 086 471 A1 or in the thesis manuscript, an advantage of using two piezoelectric elements is that the output voltage is isolated from the input voltage, without the need for a transformer.

The isolation is capacitive and is therefore not achieved with a lossy transformer, but by the fact that the impedance of the piezoelectric resonator is very high at low frequencies and blocks any propagation of the low frequency voltage from the input to the output and vice versa. Furthermore, the input common mode component equal to half the sum of the potentials at the input voltage application terminals does not affect the output common mode component equal to half the sum of the potentials at the output voltage supply terminals, and vice versa. The input and output common mode potentials or components can thus fluctuate freely, at low frequency, relative to each other. In fact, each piezoelectric element is modelled as a capacitor and a resonant branch connected in parallel to the capacitor, the capacitance of said capacitor being referred to as the parallel capacitance, or reference capacitance, and denoted $C_0$. A low frequency signal of the 50/60 Hz type will then be filtered by the high impedance (e.g. 3.1 M$\Omega$ for $C_0$=1 nF at 50 Hz) of each of the blocked capacitors of the two piezoelectric resonators, thus creating an isolation between the input and output parts of the converter.

This advantage is present even in comparison to a piezoelectric transformer, in which not all the energy supplied to the primary is completely transmitted to the secondary, and the primary must also set in motion a larger mass, namely that of the primary plus that of the secondary, which generates losses.

However, the operation of such a converter is not optimal around the resonant frequency of the piezoelectric elements.

SUMMARY

The purpose of the invention is thus to propose an electronic device, and an associated method, for driving such an electrical energy converter, offering improved control of the converter, in particular better insulation.

To that end, an object of the invention is an electronic device for controlling an electrical energy converter able to convert an input voltage into at least one output voltage, the converter comprising a first switching bridge comprising two first switching branches, each first switching branch being connected between two input voltage applying terminals and comprising at least two first switches connected in series and linked together at a first midpoint; at least one second switching bridge comprising two second switching branches, each second switching branch being connected between two output voltage supply terminals and comprising at least two second switches connected in series and linked together at a second midpoint; and at least one pair of first and second piezoelectric assemblies, each piezoelectric assembly comprising at least one piezoelectric element and being connected between respective first and second midpoints, the midpoints between which the piezoelectric assemblies are connected being distinct from one piezoelectric assembly to the other;

the electronic control device is configured to command, during a respective resonance cycle of the piezoelectric assemblies, a switching of each of the switches to alternate phases at substantially constant voltage across the piezoelectric assemblies and phases at substantially constant load across said piezoelectric assemblies, the electronic control device being further configured so as, during each phase with a substantially constant load, to command into the closed position at the same time at most one respective switch among the switches directly connected to the first piezoelectric assembly and at most one respective switch among the switches directly connected to the second piezoelectric assembly, and into the open position all the other switches of the first and second switching branches.

With the prior art converter and associated control device, if the DC or low-frequency component, typically below 1 kHz, is naturally filtered by the capacitive behaviour of the low-frequency piezoelectric as described above, the components around the resonant frequency of the piezoelectric naturally flow from input to output and vice versa.

With the control device according to the invention, the conversion cycle is adapted so that the latter allows power to be transferred from the input to the output, but without injecting a common mode component.

During phases at substantially constant voltage across the piezoelectric assemblies, the voltage across the piezoelectric assemblies does not vary and cannot induce a high frequency common mode voltage.

During phases at substantially constant load across said piezoelectric assemblies, the closed position of at most one respective one of the switches directly connected to the first piezoelectric assembly and at most one respective one of the switches directly connected to the second piezoelectric assembly at the same time, all other switches of the first and second switching branches being in the open position, avoids the connection of either of the piezoelectric assemblies between a potential of the input voltage and a potential of the output voltage, and thus avoids the introduction of a high-frequency common mode component between the input voltage and the output voltage.

According to other beneficial aspects of the invention, the electronic control device comprises one or more of the following features, taken in isolation or in any technically possible combination:

the value of the voltage of each phase at substantially constant voltage is distinct from the zero value;

the value of the voltage of each of the phases at substantially constant voltage is selected from the group consisting of: the difference between the value of the input voltage and that of the output voltage; the difference between the value of the output voltage and that of the input voltage; the sum of the values of the input and output voltages; and the opposite of the sum of the values of the input and output voltages.

the number of phases at substantially constant voltage during a respective resonance cycle is greater than or equal to 3;

the number of phases at substantially constant voltage during a respective resonance cycle preferably being equal to 3;

The invention further relates to an electronic system for converting electrical energy comprising:

an electrical energy converter capable of converting an input voltage into at least one output voltage, and comprising:

a first switching bridge comprising two first switching branches, each first switching branch being connected between two input voltage application terminals and comprising at least two first switches connected in series and linked together at a first midpoint;

at least one second switching bridge with two second switching branches, each second switching branch being connected between two output voltage supply terminals and comprising at least two second switches connected in series and linked together at a second midpoint;

at least one pair of first and second piezoelectric assemblies, each piezoelectric assembly comprising at least one piezoelectric element and being connected between respective first and second midpoints, the midpoints between which the piezoelectric assemblies are connected being distinct from one piezoelectric assembly to the other; and an electronic device for controlling the electrical energy converter, the control device being as defined above.

According to other beneficial aspects of the invention, the electronic system for electrical energy conversion comprises one or more of the following features, taken in isolation or in any technically possible combination:

the electronic system for electrical energy conversion is a DC electrical energy conversion system, such as a DC-DC conversion system or an AC-DC conversion system;

the electrical energy converter is capable of converting the input voltage into a number of distinct output voltages, and comprises for each respective output voltage:

a respective second switching bridge, each second switching branch being connected between two respective output voltage supply terminals;

a respective pair of first and second piezoelectric assemblies;

each piezoelectric assembly consists of one of the group consisting of: a single piezoelectric element; a plurality of piezoelectric elements connected in series; a plurality of piezoelectric elements connected in parallel; a piezoelectric element and an auxiliary capacitor connected in series; a piezoelectric element and an auxiliary capacitor connected in parallel; and an arrangement of a plurality of parallel piezoelectric branches, each branch comprising one or more piezoelectric elements connected in series or an auxiliary capacitor;

the auxiliary capacitor preferably having a capacitance greater than, preferably at least three times greater than, a reference capacitance of the piezoelectric element(s), each piezoelectric element being modelled as a capacitor and a resonant branch connected in parallel to the capacitor, the reference capacitance being the capacitance of said capacitor;

the converter further comprises at least one switching aid circuit, each switching aid circuit being connected to a respective one of the first and second midpoints, each switching aid circuit being configured to, via the flow of a previously received current, discharge a parasitic capacitance of a switch of the respective switching bridge to which it is connected, and respectively charge a parasitic capacitance of another switch of said switching bridge;

the converter comprises two switching aid circuits, a first switching aid circuit being connected to the first switching bridge and a second switching aid circuit being connected to the second switching bridge;

each switching aid circuit comprises an element selected from the group consisting of: an electromagnetic coil; a first set of an electromagnetic coil and a diode connected in series; a second set of an electromagnetic coil and a capacitor connected in series; and an additional piezoelectric element;

each switching aid circuit preferably consisting of an element selected from said group.

A further object of the invention is a method for controlling an electrical energy converter able to convert an input voltage into at least one output voltage, the converter comprising a first switching bridge comprising two first switching branches, each first switching branch being connected between two input voltage applying terminals and comprising at least two first switches connected in series and linked together at a first midpoint; at least one second switching bridge comprising two second switching branches, each second switching branch being connected between two output voltage supply terminals and comprising at least two second switches connected in series and linked together at a second midpoint; and at least one pair of first and second piezoelectric assemblies, each piezoelectric assembly comprising at least one piezoelectric element and being connected between respective first and second midpoints, the midpoints between which the piezoelectric assemblies are connected being distinct from one piezoelectric assembly to the other;

the method being implemented by an electronic control device and comprising the commanding, during a respective resonance cycle of the piezoelectric assemblies, a switching of each of the switches to alternate phases at substantially constant voltage across the piezoelectric assemblies and phases at substantially constant load across said piezoelectric assemblies, and during each phase with a substantially constant load, at most one respective switch among the switches directly connected to the first piezoelectric assembly and at most one respective switch among the switches directly connected to the second piezoelectric assembly, and into the open position all the other switches of the first and second switching branches are commanded into the open position.

BRIEF DESCRIPTION OF THE DRAWINGS

These features and advantages of the invention will appear more clearly upon reading the following description, given solely as a non-limiting example, and made in reference to the attached drawings, in which.

DETAILED DESCRIPTION

The phrase "substantially equal to" means being equal within 10%, and preferably within 5%.

Figure 1:
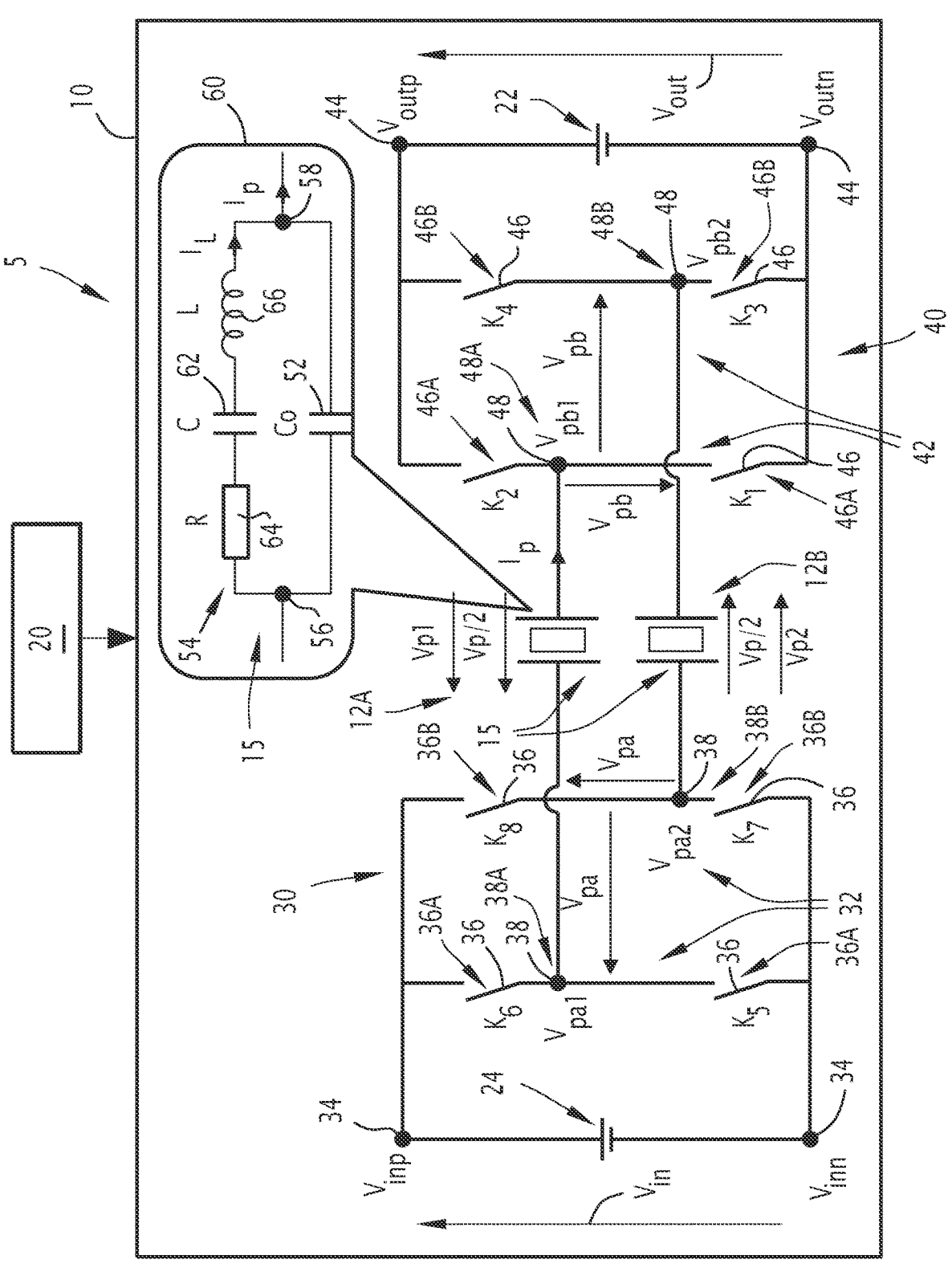
FIG. 1 is a schematic representation of an electronic system for electrical energy conversion according to the invention, comprising an electrical energy converter and an electronic device for controlling said converter, the converter comprising a first switching bridge with two first switching branches each formed by two first switches connected in series and linked at a first midpoint, a second switching bridge with two second switching branches each formed by two second switches connected in series and linked at a second midpoint, a pair of first and second piezoelectric assemblies, each piezoelectric assembly comprising a piezoelectric element and being connected between respective first and second midpoints, the midpoints between which the piezoelectric assemblies are connected being distinct from one piezoelectric assembly to the other the first, and respectively second, bridges being connected between two terminals for applying an input voltage, and respectively between two terminals for supplying an output voltage.

In FIG. 1, an electronic system for electrical energy conversion 5 comprises an electrical energy converter 10 having a pair of first 12A and second 12B piezoelectric assemblies, each piezoelectric assembly 12A, 12B having at least one piezoelectric element 15, the converter 10 comprising a plurality of switches $K_1$, $K_2$, $K_3$, $K_4$, $K_5$, $K_6$, $K_7$, $K_8$ capable of being commanded to alternate phases II, IV, VI at substantially constant voltage across the piezoelectric assemblies 12A, 12B and phases I, III, V at substantially constant load across the piezoelectric assemblies 12A, 12B.

The electronic system 5 for electrical energy conversion further comprises an electronic device 20 for driving the electrical energy converter 10.

The electronic system 5 for electrical energy conversion is typically a DC power conversion system, such as a DC-DC conversion system capable of converting a first inputted DC power or voltage into a second outputted DC power or voltage, or an AC-DC conversion system capable of converting an inputted AC power or voltage into an outputted DC power or voltage of the conversion system 5.

When the electrical energy conversion system 5 is an AC-DC conversion system, the electrical energy conversion system 5 preferably further comprises a voltage rectifier, not shown, connected to the input of the electrical energy converter 10 and capable of rectifying the AC electrical voltage received at the input of the conversion system 5 to provide a rectified electrical voltage at the input of the converter 10, the electrical energy converter 10 preferably being a DC-DC converter capable of converting DC electrical energy or voltage into another DC electrical energy or voltage. The voltage rectifier is for example a bridge rectifier, such as a diode bridge. Alternatively, the voltage rectifier is formed in part by switches of the converter 10.

Figure 2:
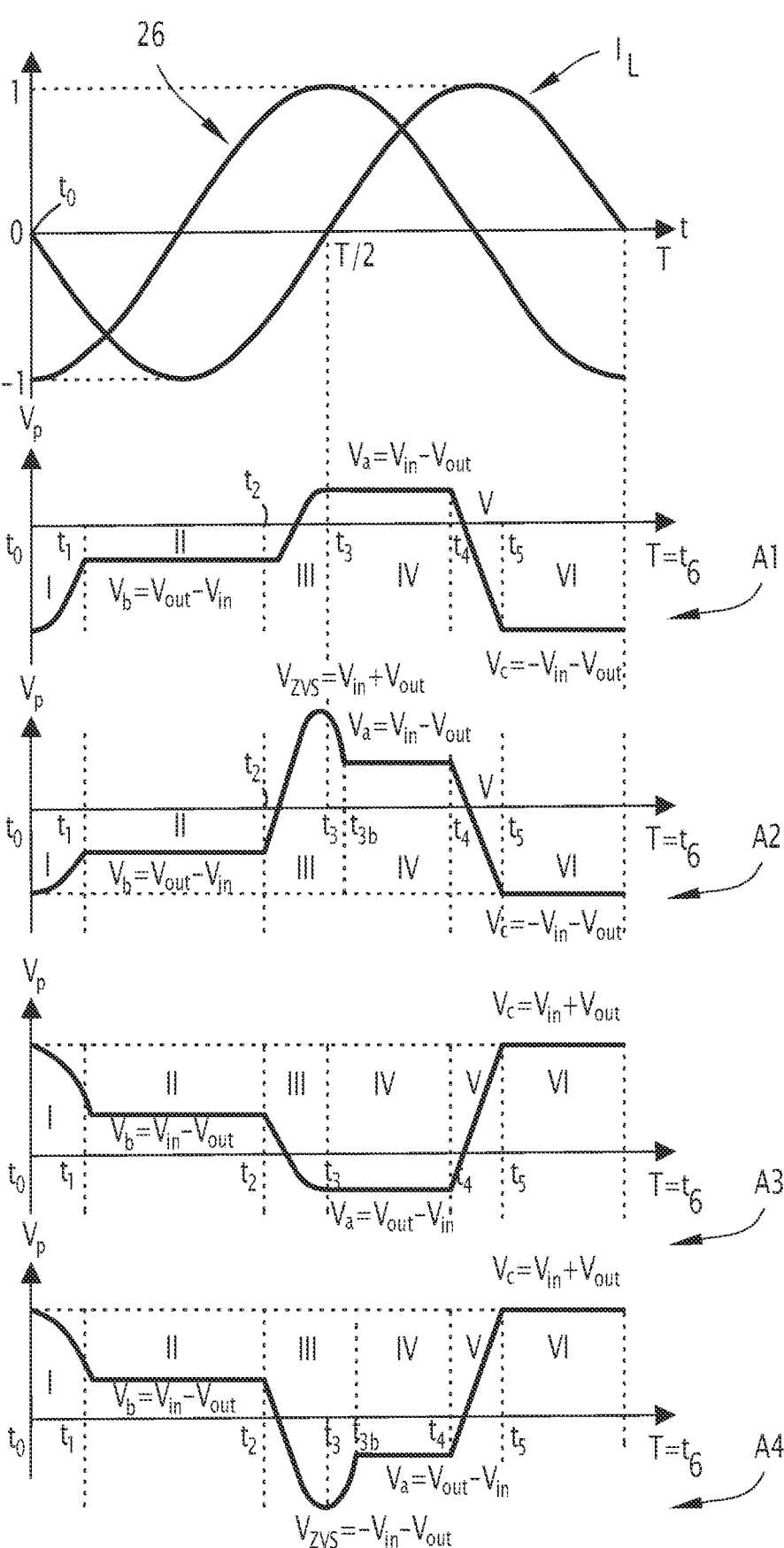
FIG. 2 is a set of curves representing a current flowing in the piezoelectric assemblies normalized to an amplitude of 1, a total mechanical deformation of the piezoelectric assemblies normalized to an amplitude of 1, a voltage between ends of said pair of piezoelectric assemblies, a voltage between the other ends of said pair of piezoelectric assemblies, and a total voltage of the piezoelectric assemblies corresponding to the sum of said elementary voltages at the terminals of each piezoelectric assembly, and this for different configurations of electrical energy conversions, namely for four step-down configurations.

The skilled person will note that these different examples for the conversion system 5, whether it is a DC-DC conversion system or an AC-DC conversion system, are also presented in the documents FR 3 086 471 A1 and FR 3 086 472 A1, in particular in relation to their FIGS. 1 and 2.

The electrical energy converter 10 is preferably a DC-DC converter, and is also called a DC-DC converter. The DC-DC converter is generally intended to regulate a supply voltage to a load 22 to a stable value, by being supplied by a power source 24 providing a substantially DC voltage. The power source 24 is for example a battery or a solar panel.

The electrical energy converter 10 is then configured to raise the value of the DC voltage between its input and its output, and is then also called a DC-DC step-up converter; or is configured to lower the value of the DC voltage between its input and its output, and is then called a DC-DC step-down converter.

The electrical energy converter 10 is configured to provide N distinct output voltage(s) from E distinct input voltage(s), where E and N are each an integer greater than or equal to 1.

In the example shown in FIG. 1, the electrical energy converter 10 is configured to provide an output voltage, denoted $V_{out}$, from an input voltage, denoted $V_{in}$, whereby the number E of input voltages and the number N of output voltages are each equal to 1.

Figure 4:
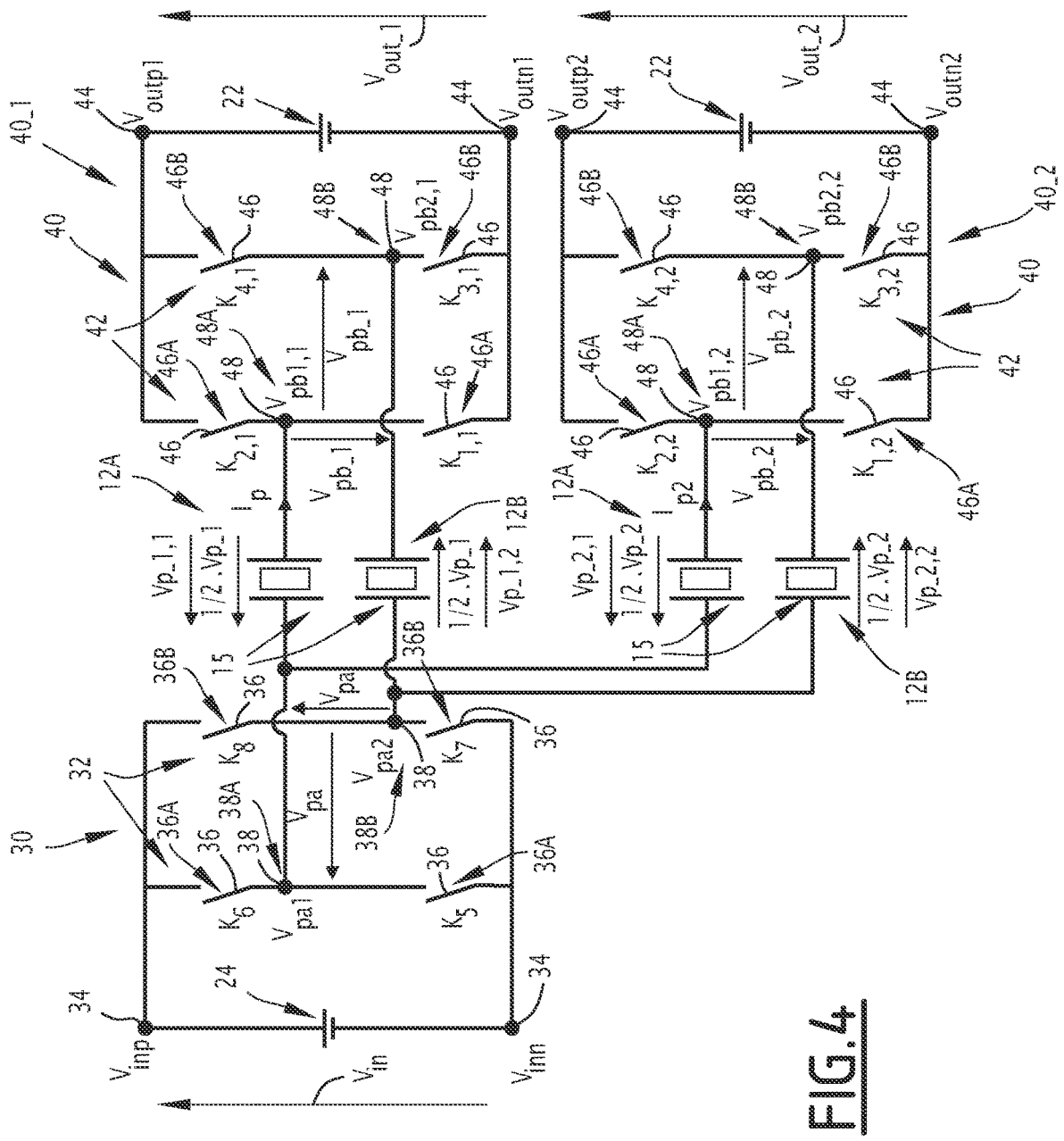
FIG. 4 is a similar view to FIG. 1, according to another example of the electrical energy converter, wherein the electrical energy converter is capable of converting the input voltage into a number of distinct output voltages, and comprises—for each respective output voltage—a respective second switching bridge, each second switching branch being connected between two supply terminals of said respective output voltage, and a respective pair of first and second piezoelectric assemblies.

In the example shown in FIG. 4, the electrical energy converter 10 is configured to provide a plurality of distinct output voltages, denoted $V_{out\_j}$ where j is an integer index between 1 and N, from the input voltage $V_{in}$, the number N of distinct output voltages being greater than 1. According to this example, the converter 10 is typically connected to several loads 22, as shown in FIG. 4.

The electrical energy converter 10 comprises piezoelectric assemblies 12A, 12B each formed of one or more piezoelectric elements 15, and the control device 20 is configured to operate the piezoelectric material of the piezoelectric elements 15 at their resonance in order to exploit load transfer phases to dispense with the use of an inductive element, while regulating the output voltage by maintaining the resonance of the piezoelectric material, i.e. with repeated switching cycles at an operating frequency depending on the resonance frequency of the piezoelectric elements 15, and by adjusting the durations of the respective switching phases within the resonance cycle.

In the steady state, the piezoelectric assemblies 12A, 12B exchange a load and substantially zero power over a resonant cycle, except for losses. In other words, each piezoelectric assembly 12A, 12B gives back substantially as much energy and load as it receives over a period. Two operating conditions then apply to the steady state/settled state, namely load balance and energy balance over a resonant period. Even if during transients (start-up, variation of voltage steps, change of output current) this balance is not respected, it must still be possible to achieve it in steady state. In particular, this requires a certain arrangement of the voltage steps during the resonance period. For example, for three voltage step operation, the two extreme voltage steps are controlled during one half-period of a given polarity of a current $I_L$ flowing through the piezoelectric elements 15, and the intermediate voltage step is controlled during the other half-period of opposite polarity of the current $I_L$ flowing through the piezoelectric elements 15.

As is known per se, the mechanical oscillation of the piezoelectric elements 15 is approximately sinusoidal, as represented in FIGS. 2, 3, 7 and 9 by the curve 26 showing the total mechanical deformation of the piezoelectric elements 15 during a respective resonance cycle. The total mechanical deformation of the piezoelectric elements 15 is the sum of the elementary mechanical deformations of each of the piezoelectric elements 15.

An increase or decrease in the energy stored over a period leads to an increase or decrease in the oscillation amplitude, respectively. Furthermore, during a phase with a substantially constant load at the terminals of the piezoelectric assemblies 12A, 12B, i.e. when the piezoelectric elements 15 are placed in a substantially open electrical circuit, with little exchange of electrical loads between the piezoelectric elements 15 and the outside, an increase in the amplitude of the oscillations causes an increase in the rate of change of the voltage $V_p$ across the piezoelectric assemblies 12A, 12B, and during a phase II, IV, VI at substantially constant voltage across the piezoelectric assemblies 12A, 12B, this increase in the amplitude of the oscillations leads to an increase in a current $I_p$ exchanged between the piezoelectric elements 15 and the voltage stages.

Substantially constant load means an exchange of charge with the exterior that is less than 10% of the load that would have been exchanged with the exterior if the voltage had been kept constant. In other words, a substantially constant load means a variation in load of less than 10% of the load that would have been exchanged with the exterior of the piezoelectric assemblies 12A, 12B if the voltage across the piezoelectric assemblies 12A, 12B had been held constant over the time period in question.

Substantially open electrical circuit means a circuit in which any leakage current leads to a variation in the load of the piezoelectric assemblies 12A, 12B of less than 10% of the load that would have been exchanged with the exterior of the piezoelectric assemblies 12A, 12B if the voltage across the terminals of the piezoelectric assemblies 12A, 12B had been held constant over the time period in question.

Substantially constant voltage means a voltage variation of less than 20%, preferably less than 10%, of the input or output voltage of the converter 10. For example, if the input voltage of the converter 10 is 100V, then the voltage variation during each phase II, IV, VI at substantially constant voltage, i.e. on each step at substantially constant voltage, is less than 20% of this voltage, i.e. less than 20V; preferably less than 10% of this voltage, i.e. less than 10V. Each phase at substantially constant voltage is also called a voltage step.

Figure 5:
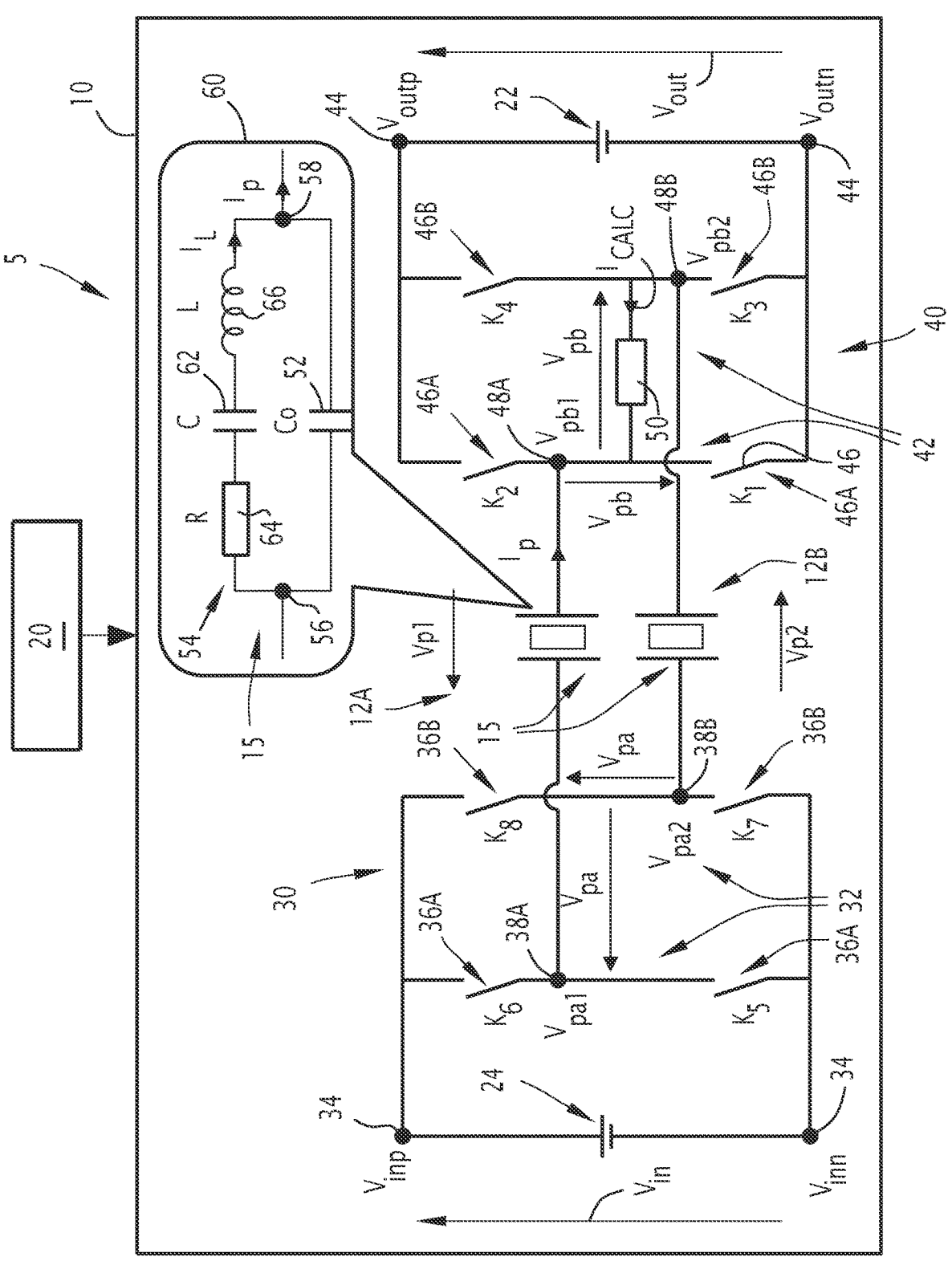
FIG. 5 is a view similar to FIG. 1, in a complementary aspect where the converter further comprises a switching aid circuit connected between the first and second midpoints of the second bridge.
Figure 8:
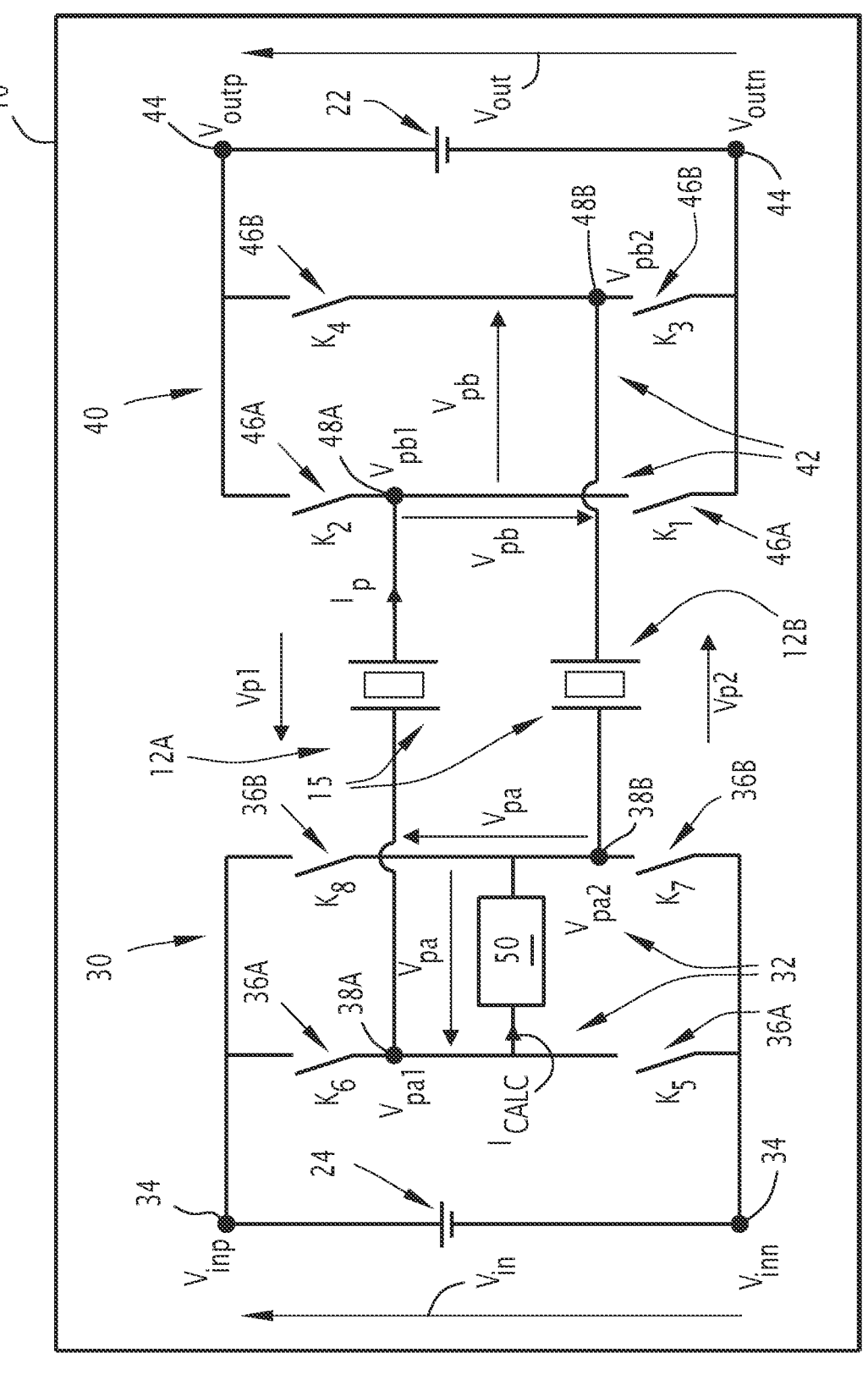
FIG. 8 is a view similar to FIG. 5, according to an alternative embodiment of the complementary aspect, where the switching aid circuit is connected between the first and second midpoints of the first bridge.

The converter 10 then comprises several switches $K_1$, $K_2$, $K_3$, $K_4$, $K_5$, $K_6$, $K_7$, $K_8$ visible in FIGS. 1, 5 and 8, $K_{1,1}$, $K_{2,1}$, $K_{3,1}$, $K_{4,1}$, $K_{1,2}$, $K_{2,2}$, $K_{3,2}$, $K_{4,2}$, $K_5$, $K_6$, $K_7$, $K_8$ visible in FIG. 4, able to be commanded to alternate phases II, IV, VI at substantially constant voltage and phases I, III, V at substantially constant load at the terminals of the piezoelectric assemblies 12A, 12B, within periods of substantially constant duration corresponding to the operating frequency of the converter 10, depending on the resonance frequency, also called natural frequency, of the piezoelectric elements 15. Phases I, III, V with a substantially constant load make it possible, in steady state or permanent operation, to switch from one constant voltage to another and to close the switches that must be closed when the voltage at their terminals is preferably zero, in order to have a so-called zero voltage switching, also called ZVS mode.

In particular, the converter 10 comprises a first switching bridge 30 comprising two first switching branches 32, each first switching branch 32 being connected between two input voltage $V_{in}$ application terminals 34 and comprising at least two first switches 36 connected in series and linked together at a first midpoint 38. Of the two application terminals 34, one has a lower potential, denoted $V_{inn}$, than the other, denoted $V_{inp}$. The first switching bridge 30 preferably consists of the first two switching branches 32.

In the examples of FIGS. 1, 4, 5 and 8, each first switching branch 32 comprises two first switches 36 connected in series and joined at the first midpoint 38. Each first switching branch 32 preferably consists of the first two switches 36.

In these examples, the first two switches 36 are denoted $K_5$, $K_6$ for one of the first two switching branches 32, and $K_7$, $K_8$ for the other of the first two switching branches 32 respectively.

To distinguish between the first switches 36 connected directly to the first piezoelectric assembly 12A and those connected directly to the second piezoelectric assembly 12B, the first switches 36 connected directly to the first piezoelectric assembly 12A are also referred to as 36A, and the first switches 36 connected directly to the second piezoelectric assembly 12B are also referred to as 36B.

In the examples of FIGS. 1, 4, 5 and 8, the first switches 36A connected directly to the first piezoelectric assembly 12A are also referred to as $K_5$, $K_6$, and the first switches 36B connected directly to the second piezoelectric assembly 12B are also referred to as $K_7$, $K_8$.

Similarly, the first midpoint 38 connected directly to the first piezoelectric assembly 12A is also denoted 38A, and the first midpoint 38 connected directly to the second piezoelectric assembly 12B is also denoted 38B.

The converter 10 comprises a second switching bridge 40 with two second switching branches 42, each second switching branch 42 being connected between two output voltage $V_{out}$ supply terminals 44 and comprising at least two second switches 46 connected in series and linked together at a second midpoint 48. Of the two supply terminals 44, one has a lower potential, denoted $V_{outn}$, than the other, denoted $V_{outp}$. The second switching bridge 40 preferably consists of the two second switching branches 42.

In the examples of FIGS. 1, 4, 5 and 8, each second switching branch 42 comprises two second switches 46 connected in series and joined at the second midpoint 48. Each second switching branch 42 preferably consists of the two second switches 46.

In the examples of FIGS. 1, 5, and 8, the second two switches 46 are denoted $K_1$, $K_2$ for one of the second two switching branches 42, and $K_3$, $K_4$ for the other of the second two switching branches 42 respectively.

When the electrical energy converter 10 is configured to provide a plurality of distinct output voltages $V_{out\_j}$, it comprises, for each respective output voltage $V_{out\_j}$, a respective second switching bridge 40, each second switching branch 42 being connected between two terminals 44 for supplying the respective output voltage $V_{out\_j}$.

In the example shown in FIG. 4, the electrical energy converter 10 is configured to provide two distinct output voltages, namely a first output voltage $V_{out\_1}$ and a second output voltage $V_{out\_2}$. According to this example, the converter 10 then comprises two second switching bridges 40, the one associated with the first output voltage $V_{out\_1}$ being noted 40\_1 and the one associated with the second output voltage $V_{out\_2}$ being noted 40\_2. Each second switching branch 42 being connected between two terminals 44 for supplying the respective output voltage $V_{out\_1}$, $V_{out\_2}$. In this example, the lower potentials of the output voltages $V_{out\_1}$, $V_{out\_2}$ are denoted $V_{outn1}$, $V_{outn2}$ respectively, and the higher potentials of the output voltages $V_{out\_1}$, $V_{out\_2}$ are denoted $V_{outp1}$, $V_{outp2}$ respectively. Again in this example, the second switches 46 are denoted $K_{1,1}$, $K_{2,1}$, $K_{3,1}$, $K_{4,1}$ for the second switching bridge 40\_1 associated with the first output voltage $V_{out\_1}$, and the second switches 46 are denoted $K_{1,2}$, $K_{2,2}$, $K_{3,2}$, $K_{4,2}$ for the second switching bridge 40\_2 associated with the second output voltage $V_{out\_2}$.

To distinguish between the second switches 46 connected directly to the first piezoelectric assembly 12A and those connected directly to the second piezoelectric assembly 12B, the second switches 46 connected directly to the first piezoelectric assembly 12A are also referred to as 46A, and the second switches 46 connected directly to the second piezoelectric assembly 12B are also referred to as 46B.

In the examples of FIGS. 1, 5 and 8, the second switches 46A connected directly to the first piezoelectric assembly 12A are also referred to as $K_1$, $K_2$, and the second switches 46B connected directly to the second piezoelectric assembly 12B are also referred to as $K_3$, $K_4$.

In the example shown in FIG. 4, the second switches 46A connected directly to the first piezoelectric assembly 12A are also denoted $K_{1,1}$, $K_{2,1}$, for the second switching bridge 40\_1 associated with the first output voltage $V_{out\_1}$, and $K_{1,2}$, $K_{2,2}$, for the second switching bridge 40\_2 associated with the second output voltage $V_{out\_2}$. In this example, the second switches 46A connected directly to the second piezoelectric assembly 12A are also denoted $K_{3,1}$, $K_{4,1}$, for the second switching bridge 40\_1 associated with the first output voltage $V_{out\_1}$, and $K_{3,2}$, $K_{4,2}$, for the second switching bridge 40\_2 associated with the second output voltage $V_{out\_2}$.

Similarly, the second midpoint 48 connected directly to the first piezoelectric assembly 12A is also denoted 48A, and the second midpoint 48 connected directly to the second piezoelectric assembly 12B is also denoted 48B.

The converter 10 comprises one or more pairs of first 12A and second 12B piezoelectric assemblies, each piezoelectric assembly 12A, 12B having at least one piezoelectric element 15 and being connected between respective first 38 and second 48 midpoints, the midpoints 38, 48 between which the piezoelectric assemblies 12A, 12B are connected being distinct from one piezoelectric assembly 12A to the other 12B.

In the examples shown in FIGS. 1, 5 and 8, the converter 10 comprises a single pair of first 12A and second 12B piezoelectric assemblies.

When the electrical energy converter 10 is configured to provide a plurality of distinct output voltages $V_{out\_j}$, it comprises, for each respective output voltage $V_{out\_j}$, a respective pair of first 12A and second 12B piezoelectric assemblies.

In the example shown in FIG. 4, the electrical energy converter 10 is configured to provide two distinct output voltages, and thus comprises two pairs of first 12A and second 12B piezoelectric assemblies.

Each switch in the converter 10, i.e. each of the first 36 and second 46 switches, is preferably a unidirectional current and unidirectional voltage switch. The switch 36, 46 comprises for example a transistor, or a diode, or a transistor and a diode in antiparallel, not shown. The switch 36, 46 preferably consists of the transistor, or the diode, or the transistor and the diode in antiparallel. Alternatively, the switch 36, 46 comprises a combination of several transistors, and preferably consists of such a combination of several transistors. Alternatively, the switch 36, 46 comprises a mechanical switch, such as a MicroElectroMechanical System (MEMS) microswitch.

The transistor is, for example, an insulated gate field effect transistor, also known as a MOSFET (Metal Oxide Semiconductor Field Effect Transistor). Alternatively, the transistor is a bipolar transistor; an insulated gate bipolar transistor, also known as an IGBT (Insulated Gate Bipolar Transistor); a silicon (Si) based transistor; a GaN (Gallium Nitride) based transistor; a silicon carbide (SiC) based transistor; or a diamond-based transistor; or a thyristor.

Each piezoelectric assembly 12A, 12B consists of one of the group consisting of: a single piezoelectric element 15; a plurality of piezoelectric elements 15 connected in series; a plurality of piezoelectric elements 15 connected in parallel; a piezoelectric element 15 and an auxiliary capacitor, not shown, connected in series; a piezoelectric element 15 and an auxiliary capacitor connected in parallel; and an arrangement of a plurality of parallel branches, each branch comprising one or more piezoelectric elements 15 connected in series or an auxiliary capacitor.

The auxiliary capacitor is typically larger, preferably at least three times larger, than a reference capacitance $C_0$, described below, of the piezoelectric element(s) 15.

As an optional addition, the first 12A and second 12B piezoelectric assemblies share a common piezoelectric material, while having the electrodes of the first assembly 12A distinct from those of the second assembly 12B. According to this optional addition, the electrode pairs of the first set 12A, and respectively those of the second set 12B, cover distinct material surfaces. Furthermore, the electrodes of the first assembly 12A cannot in this case directly induce a significant electric field in the part of the piezoelectric material belonging to the second assembly 12B. According to this further optional complement, the capacitance between any one of the electrodes of the first assembly 12A and any one of the electrodes of the second assembly 12B is negligible (at least 10 times smaller) compared to a reference capacitance $C_0$, described below, of each of the assemblies 12A, 12B, e.g. by not directly facing each other across the material. This pooling of the same material makes it possible, for example, to facilitate the implementation of the first 12A and second 12B piezoelectric assemblies (limitation of the number of part(s), pooling of the fastening means); and also to synchronise the vibration of the two assemblies 12A, 12B, without there being a significant transfer of energy from one assembly to the other ($<\frac{1}{10}^{th}$ of the output power).

The piezoelectric element 15 is known per se, and is typically modelled, close to the resonance mode operated, as a capacitor 52 and a resonant branch 54 connected in parallel to the capacitor 52, the capacitor 52 and resonant branch 54 being connected between a first electrode 56 and a second electrode 58 of the piezoelectric element 15, as illustrated in the modelling of the piezoelectric element 15 shown in a bubble 60 in FIG. 1. The resonant branch 54 is typically an RLC branch formed by a capacitor 62, a resistor 64 and a coil 66 connected in series. The capacitance of the capacitor 52 connected in parallel with the resonant branch 54 is called the parallel capacitance, or blocked capacitance, or reference capacitance, and is denoted $C_0$. The voltage at the terminals of the piezoelectric element 15 then typically corresponds to the voltage at the terminals of the capacitor 52.

In the present description, a so-called total piezoelectric voltage $V_p$ is by convention the sum of each of the voltages across the first 12A and second 12B piezoelectric assemblies, respectively. In particular, the voltage across the first piezoelectric assembly 12A is denoted $V_{p1}$, and that across the second piezoelectric assembly 12B is denoted $V_{p2}$. The total piezoelectric voltage $V_p$ is then equal to the sum of these voltages $V_{p1}$ and $V_{p2}$, i.e. $V_{p1}+V_{p2}$. The two piezoelectric assemblies 12A, 12B, and the piezoelectric elements 15 constituting them, are preferably identical, and have substantially the same voltage at their terminals within a possible offset voltage $V_{offset}$, so that the voltages $V_{p1}$ and $V_{p2}$ are equal to $V_p/2+/-V_{offset}$, according to the following equations:

$$V_p = V_{p1} + V_{p2} \qquad [1]$$

$$V_{p1} = \frac{V_p}{2} + V_{offset} \qquad [2]$$

et $$V_{p2} = \frac{V_p}{2} - V_{offset}$$

The voltage $V_{offset}$ is a substantially constant component across a resonant period and has little impact on the charge or energy balance over a period. This voltage $V_{offset}$ evolves slowly with respect to the control frequency, its ripple is typically at a frequency at least 10 times lower than the control frequency of the piezoelectric assemblies 12A, 12B. Moreover, when the voltages $V_{p1}+V_{p2}$ are added together, this offset voltage $V_{offset}$ disappears, and we obtain the total piezoelectric voltage $V_p$, as described in the different cycles. In practice, this voltage $V_{offset}$ does not affect the control law, and allows completely independent potentials $V_{inn}$ and $V_{outn}$ at low frequency.

In the example shown in FIG. 4, where the electrical energy converter 10 is configured to provide the first $V_{out\_1}$, and second $V_{out\_2}$ output voltages and thus comprises two pairs of first 12A and second 12B piezoelectric assemblies, the total piezoelectric voltage for a first pair of first 12A and second 12B piezoelectric assemblies associated with the first output voltage $V_{out\_1}$ is denoted $V_{p\_1}$, and that for a second pair of first 12A and second 12B piezoelectric assemblies associated with the second output voltage $V_{out\_2}$ is denoted $V_{p\_2}$. In particular, the voltage across the first piezoelectric assembly 12A is denoted $V_{p\_1,1}$ for the first pair and $V_{p\_2,1}$ for the second pair, and that across the second piezoelectric assembly 12B is denoted $V_{p\_1,2}$ for the first pair and $V_{p\_2,2}$ for the second pair. Each total piezoelectric voltage $V_{p\_1}$, $V_{p\_2}$ is then equal to the sum of these respective voltages $V_{p\_1,1}$, $V_{p\_1,2}$ and $V_{p\_2,1}$, $V_{p\_2,2}$, i.e. $V_{p\_1,1}+V_{p\_1,2}$, and $V_{p\_2,1}+V_{p\_2,2}$ respectively. The two piezoelectric assemblies 12A, 12B, and the piezoelectric elements 15 constituting them, are preferably identical, and have substantially the same voltage at their terminals within a possible offset voltage $V_{offset\_1}$, $V_{offset\_2}$, so that the voltages $V_{p\_1,1}$, $V_{p\_2,1}$ et $V_{p\_1,2}$, $V_{p\_2,2}$ are each equal to half the respective total piezoelectric voltage $V_{p\_1}+/-V_{offset\_1}$, $V_{p\_2}+/-V_{offset\_2}$, according to the following equations:

$$V_{p\_1} = V_{p\_1,1} + V_{p\_1,2} \qquad [3]$$

$$V_{p\_1,1} = \frac{V_{p\_1}}{2} + V_{offset\_1} \qquad [4]$$

et

US 12,652,960 B2

13

-continued $$V_{p\_1,2} = \frac{V_{p\_1}}{2} - V_{offset\_1}$$

$$V_{p\_2} = V_{p\_2,1} + V_{p\_2,2} \qquad [5]$$

$$V_{p\_2,1} = \frac{V_{p\_2}}{2} + V_{offset\_2} \qquad [6]$$

et $$V_{p\_2,2} = \frac{V_{p\_2}}{2} - V_{offset\_2}$$

Furthermore, in the present description and as shown in FIGS. 1, 5 and 8, the voltage between the first midpoints 38 is denoted $V_{pa}$, and is by convention equal to the difference in potentials ($V_{pa1}$–$V_{pa2}$), where $V_{pa1}$ is the potential of the first midpoint 38 connected to the first piezoelectric assembly 12A, and $V_{pa2}$ is the potential of the other first midpoint 38 connected to the second piezoelectric assembly 12B. The voltage between the second midpoints 48 is denoted $V_{pb}$, and is by convention equal to the difference in potentials ($V_{pb1}$–$V_{pb2}$), where $V_{pb1}$ is the potential of the second midpoint 48 connected to the first piezoelectric assembly 12A, and $V_{pb2}$ is the potential of the other second midpoint 48 connected to the second piezoelectric assembly 12B.

By convention and as shown in FIGS. 1, 5 and 8, the voltage across the first piezoelectric assembly $V_{p1}$ is equal to the difference in potentials ($V_{pa1}$–$V_{pb1,1}$), and that across the second piezoelectric assembly $V_{p2}$ is equal to the difference in potentials ($V_{pb2}$–$V_{pa2}$).

In the example of FIG. 4 where the electrical energy converter 10 comprises two pairs of first 12A and second 12B piezoelectric assemblies and two second switching bridges 40_1, 40_2, the voltage between the first midpoints 38 is also denoted $V_{pa}$, and is by convention equal to the difference in potentials ($V_{pa1}$–$V_{pa2}$), where $V_{pa1}$ is the potential of the first midpoint 38 connected to the first piezoelectric assembly 12A, and $V_{pa2}$ is the potential of the other first midpoint 38 connected to the second piezoelectric assembly 12B. The voltage between the second midpoints 48 is denoted $V_{pb\_1}$ for the second switching bridge 40_1 associated with the first output voltage $V_{out\_1}$, is by convention equal to the difference in potentials ($V_{pb2,1}$–$V_{pb1,1}$), where $V_{pb1,1}$ is the potential of the second midpoint 48 connected to the first piezoelectric assembly 12A, and $V_{pb2,1}$ is the potential of the other second midpoint 48 connected to the second piezoelectric assembly 12B, for the second switching bridge 40_1 associated with the first output voltage $V_{out\_1}$. Likewise, the voltage between the second midpoints 48 is denoted $V_{pb\_2}$ for the second switching bridge 40_2 associated with the second output voltage $V_{out\_2}$, is by convention equal to the difference in potentials ($V_{pb2,2}$–$V_{pb1,2}$), where $V_{pb1,2}$ is the potential of the second midpoint 48 connected to the first piezoelectric assembly 12A, and $V_{pb2,2}$ is the potential of the other second midpoint 48 connected to the second piezoelectric assembly 12B, for the second switching bridge 40_2 associated with the second output voltage $V_{out\_2}$.

By convention and as shown in FIG. 4, the voltage across the first piezoelectric assembly $V_{p\_1,1}$ of the first pair is equal to the difference in potentials ($V_{pa1}$–$V_{pb1,1}$), and that across the second piezoelectric assembly $V_{p\_1,2}$ of the first pair is equal to the difference in potentials ($V_{pb2,1}$–$V_{pa2}$). Likewise, the voltage across the first piezoelectric assembly $V_{p\_2,1}$ of the second pair is equal to the difference in potentials ($V_{pa1}$–$V_{pb1,2}$) and that across the second piezoelectric assembly $V_{p\_2,2}$ of the second pair is equal to the difference in potentials ($V_{pb2,2}$–$V_{pa2}$).

The resonant frequency is the frequency at which the piezoelectric element 15 oscillates and therefore its current $I_L$, visible in FIG. 1. The conversion cycle is synchronised to a mechanical movement of the piezoelectric element 15, and the control frequency is then set to the mechanical oscillation frequency. In practice, this oscillation frequency depends on the operating point of the converter 10: Values of the three voltage steps and the output current. Depending on the operating point, this oscillation frequency typically fluctuates between the so-called series resonance frequency of the piezoelectric element 15 ($\omega_s$=1/√($L_r$·$C_r$) where $L_r$ and $C_r$ correspond to the inductance and capacitance of the resonant branch 54 and the so-called parallel resonance frequency of the piezoelectric element 15 ($\omega_p$=1/√($L_r$·$C_r$·$C_0$/($C_r$+$C_0$))), also respectively called the resonance frequency and the anti-resonance frequency of the piezoelectric element 15. The operating frequency of the converter 10 is then between these two resonance and antiresonance frequencies of the piezoelectric element 15. The operating point varies slowly with respect to the oscillation frequency of the piezoelectric element 15. The operating point typically changes at less than 10 kHz, while the oscillation frequency of the piezoelectric element 15 is typically 100 kHz or more. As a result, the operating frequency of the converter 10 changes little from one period to the next.

Generally speaking, for the electrical energy converter 10 with the piezoelectric assemblies 12A, 12B and controlled by the electronic control device 20, the number of phases II, IV, VI at a substantially constant voltage is typically at least 2, preferably equal to 3, while it may be greater than or equal to 4 with the implementation of the control described in the application FR 21 07345 filed on 7 Jul. 2021.

Each phase II, IV, VI with a substantially constant voltage is obtainable from a combination of the input and output voltages, in positive or negative values. The energy converter 10 then allows energy to be exchanged during phases II, IV, VI at substantially constant voltage, and consequently with the voltage combinations used to achieve these phases II, IV, VI at substantially constant voltage. In particular, it is possible to transfer energy from a low-voltage, substantially constant voltage phase to a higher-voltage, substantially constant voltage phase, and by the above combinations ultimately obtain a step-down converter, which may seem counter-intuitive. Conversely, it is also possible to transfer energy from a higher-voltage, substantially constant voltage phase to a lower-voltage, substantially constant voltage phase, and by the above combinations ultimately obtain a voltage step-up converter. The skilled person will then understand that it is possible to have a step-up cycle seen by the piezoelectric assemblies 12A, 12B while the electrical energy converter 10 is a step-down converter, and conversely to have a step-down cycle seen by the piezoelectric assemblies 12A, 12B while the electrical energy converter 10 is a step-up converter.

By convention, if power is supplied to the piezoelectric assemblies 12A, 12B in phase II, IV, VI at a substantially constant voltage corresponding to the highest voltage during a resonant cycle, then the cycle is considered a step-down cycle for the piezoelectric assemblies 12A, 12B. Conversely, if power is delivered, or drawn, from the piezoelectric assemblies 12A, 12B during said substantially constant voltage phase II, IV, VI at which the voltage is highest during the resonance cycle, then the cycle is considered to be a step-up cycle for the piezoelectric assemblies 12A, 12B. As noted above, the conversion cycle seen by the piezoelectric assemblies 12A, 12B is likely to be a step-up cycle while the electrical energy converter 10 is operating as a step-down converter, and conversely the conversion cycle seen by the piezoelectric assemblies 12A, 12B is likely to be a step-down cycle while the electrical energy converter 10 is operating as a step-up converter.

The electronic control device 20 is configured to control the electrical energy converter 10, in particular to control the switches 36, 46 of the converter, in order to alternate phases II, IV, VI at substantially constant voltage across the piezoelectric assemblies 12A, 12B and phases I, III, V at substantially constant load, i.e. in a substantially open circuit, across said piezoelectric assemblies 12A, 12B.

The electronic control device 20 is, for example, designed as an electronic circuit with one or more electronic components.

Alternatively, the electronic control device 20 is implemented as a programmable logic component, such as Field-Programmable Gate Arrays (FPGAs), or as a dedicated integrated circuit, such as Application-Specific Integrated Circuits (ASICs), or as a computer, such as a microcontroller or processor.

According to the invention, the electronic control device 20 is configured so as, during each phase I, III, V with a substantially constant load, to command into the closed position at the same time at most one respective one of the switches 36A, 46A connected directly to the first piezoelectric assembly 12A and at most one respective one of the switches 36B, 46B connected directly to the second piezoelectric assembly 12B, and to command into the open position all the other switches 36, 46 of the first and second switching branches 32, 42.

In other words, during each phase I, III, V at substantially constant load, at most one respective switch among the switches 36A, 46A directly connected to the first piezoelectric assembly 12A and at most one respective switch among the switches 36B, 46B directly connected to the second piezoelectric assembly 12B are in the closed position at the same time, with all the other switches 36, 46 of the first and second switching branches 32, 42 being in the open position.

In other words, during each phase I, III, V at substantially constant load, at each moment at most one respective switch among the switches 36A, 46A directly connected to the first piezoelectric assembly 12A is in the closed position, and at most one respective switch among the switches 36B, 46B directly connected to the second piezoelectric assembly 12B are in the closed position, and all the other switches 36, 46 of the first and second switching branches 32, 42 are in the open position.

In the examples of FIGS. 1, 5 and 8, in each phase I, III, V with a substantially constant load, at most one of the switches $K_1$, $K_2$, $K_5$, $K_6$ is in the closed position, and at most one of the switches $K_3$, $K_4$, $K_7$, $K_8$ is in the closed position, with all the other switches of the first and second switching branches 32, 42 being in the open position.

In the example shown in FIG. 4, where the electrical energy converter 10 is configured to deliver the respective first $V_{out\_1}$ and second $V_{out\_2}$ output voltages, and then comprises two pairs of first 12A and second 12B piezoelectric assemblies and two second switching bridges 40_1, 40_2, on the one hand for the conversion of the input voltage $V_{in}$ into the first output voltage $V_{out\_1}$ via the first switching bridge 30 and the second switching bridge 40_1 associated with the first output voltage $V_{out\_1}$, in each phase I, III, V with a substantially constant load, at most one of the switches $K_{1,1}$, $K_{2,1}$, $K_5$, $K_6$ in each case is in the closed position, and at most one of the switches $K_{3,1}$, $K_{4,1}$, $K_7$, $K_8$ in each case is in the closed position, all the other switches of the switching bridges 30, 40_1 being in the open position. On the other hand, for the conversion of the input voltage $V_{in}$ into the second output voltage $V_{out\_2}$ via the first switching bridge 30 and the second switching bridge 40_2 associated with the second output voltage $V_{out\_2}$, in each phase I, III, V at substantially constant load at most one of the switches $K_{1,2}$, $K_{2,2}$, $K_5$, $K_6$ is in the closed position, and at most one of the switches $K_{3,2}$, $K_{4,2}$, $K_7$, $K_8$ is in the closed position, all the other switches of the switching bridges 30, 40_2 being in the open position.

In addition, the electronic control device 20 is configured to command the switches 36, 46 of the converter 10 during phases II, IV, VI with a substantially constant voltage across the piezoelectric assemblies 12A, 12B, in order to have the value $V_a$, $V_b$, $V_b$ of the voltage of each of the phases II, IV, VI with a substantially constant voltage different from the zero value.

According to this addition, the electronic control device 20 is preferably configured to, during phases II, IV, VI at substantially constant voltage at the terminals of the piezoelectric assemblies 12A, 12B, control the control of the switches 36, 46 of the converter 10, in order to have the value $V_a$, $V_b$, $V_c$ of the voltage of each of the phases II, IV, VI at substantially constant voltage selected from the group consisting of: the difference $V_{in}-V_{out}$ between the value of the input voltage $V_{in}$ and that of the output voltage $V_{out}$; the difference $V_{out}-V_{in}$ between the value of the output voltage $V_{out}$ and that of the input voltage $V_{in}$; the sum $V_{in}+V_{out}$ of the values of the input voltages $V_{in}$ and $V_{out}$; and the opposite of the sum $-V_{in}-V_{out}$ of the values of the input $V_{in}$ and output $V_{out}$ voltages.

The operation of the converter 10 in the example of FIG. 1 will now be explained according to four step-down configurations, namely a first step-down configuration A1, a second step-down configuration A2, a third step-down configuration A3 and a fourth step-down configuration A4 with respect to FIG. 2; and then according to four step-up configurations, namely a first step-up configuration E1, a second step-up configuration E2, a third step-up configuration E3 and a fourth step-up configuration E4 with respect to FIG. 3.

The method of controlling the electrical energy converter 10 is then implemented by the electronic control device 20 and comprises commanding, during a respective resonance cycle of the piezoelectric assemblies 12A, 12B, a switching of each of the switches 36, 46 to alternate phases II, IV, VI at substantially constant voltage at the terminals of the piezoelectric assemblies 12A, 12B and phases I, III, V at substantially constant load at the terminals of said piezoelectric assemblies 12A, 12B, For each of the step-down, or respectively step-up, configurations, and according to the invention, during each phase I, III, V at substantially constant load, at most one respective switch among the switches 36A, 46A directly connected to the first piezoelectric assembly 12A and at most one respective switch among the switches 36B, 46B directly connected to the second piezoelectric assembly 12B are commanded into the closed position at the same time, and all the other switches 36, 46 of the first and second switching branches 32, 42 are commanded into the open position.

The skilled person will note that a very high step-up configuration typically means a configuration where the gain, i.e. the ratio of the output voltage $V_{out}$ divided by the input voltage $V_{in}$, is greater than 2, i.e. $V_{out}/V_{in}>2$. By extension, a very low step-down configuration typically means a configuration where the gain, i.e. the ratio of the output voltage $V_{out}$ divided by the input voltage $V_{in}$, is lower than $\frac{1}{2}$, i.e. $V_{out}/V_{in}<\frac{1}{2}$.

Similarly, a step-up configuration is typically one where said gain is between 1 and 2, i.e. $V_{in}<V_{out}<2V_{in}$. By extension, a step-down configuration is typically one where said gain is between $\frac{1}{2}$ and 1, i.e. $V_{in}/2<V_{out}<V_{in}$.

Step-Down Configuration A1

By convention, for the first step-down configuration A1, the highest voltage step for the total piezoelectric voltage $V_p$ is the one at value $V_a$. During this stage, power is supplied to the piezoelectric assemblies 12A, 12B. By convention, the current $I_L$ flowing in the piezoelectric elements 15, i.e. in the piezoelectric assemblies 12A, 12B, is oriented so as to be positive during this voltage step at value $V_a$. Therefore, at constant load, the total piezoelectric voltage $V_p$ tends to decrease when the current $I_L$ is positive, and by extension, to increase when the current $I_L$ is negative.

From time $t_0$ to time $t_1$, corresponding to a first phase I, the sign of the current $I_L$ flowing in the piezoelectric elements 15 leads to an increase in the total piezoelectric voltage $V_p$. The total piezoelectric voltage $V_p$ changes from value $V_c$ equal to $-V_{in}-V_{out}$ to value $V_b$ equal to $-V_{in}+V_{out}$. Only the voltage $V_{pb}$ needs to be changed from $-V_{out}$ to $+V_{out}$, which it does naturally with the increase of the total piezoelectric voltage $V_p$, while the voltage $V_{pa}$ remains constant and fixed at $-V_{in}$ by keeping the switches $K_5$ and $K_8$ closed.

During this first phase I, with a substantially constant load, only switches $K_5$ and $K_8$ are in the closed position.

At time $t_1$, the voltages $V_{pa}$ and $V_{pb}$ have already been repositioned to the values of the next voltage step, and the switches $K_1$, $K_4$ are closed in ZVS mode, i.e. with a voltage of substantially zero at their terminals before they are closed. If the switches $K_1$ and $K_4$ have an intrinsic reverse diode or an additional diode in parallel, they can be switched on naturally according to the sign of the current. Switches $K_5$, $K_8$ were already closed.

From time $t_1$ to time $t_2$, corresponding to a second phase II, switches $K_1$, $K_4$, $K_5$ and $K_8$ are in the closed position. The total piezoelectric voltage $V_p$ is equal to $-V_{in}+V_{out}$. Positive power is drawn from the input voltage $V_{in}$ at the same time as positive power is supplied to the output voltage $V_{out}$.

From time $t_2$ to time $t_3$, corresponding to a third phase I, the sign of the current $I_L$ leads to an increase in the total piezoelectric voltage $V_p$. The total piezoelectric voltage $V_p$ therefore changes from $-V_{in}+V_{out}$ to $+V_{in}-V_{out}$. Seen from the piezoelectric assemblies 12A, 12B, applying the value $V_a$ at time $t_3$ does not induce a voltage variation across its terminals and from this point of view the closing of the switches at time $t_3$ does not induce losses for the piezoelectric assemblies 12A, 12B.

However, the voltage at the terminals of the switches is not zero and their closure induces losses due to the energy stored in their parasitic capacitances, for example their output capacitance. Indeed, the initial total piezoelectric voltage $V_p$ is $-V_{in}+V_{out}$, the voltage $V_{pa}$ being equal to $-V_{in}$ and the voltage $V_{pb}$ equal to $+V_{out}$, and the sign of the current $I_L$ allows an increase of the total piezoelectric voltage $V_p$ contributing to the increase of the voltage $V_{pa}$, but not to the decrease of the voltage $V_{pb}$ which has to change from $+V_{out}$ to $-V_{out}$. Thus, at time $t_3$, the voltage $V_{pb}$ is still at $V_{out}$ while the voltage $V_{pa}$ is equal to the total piezoelectric voltage $V_p$ minus the voltage $V_{pb}$, i.e. $(+V_{in}-V_{out})-V_{out}$, or $V_{in}-2V_{out}$.

Prior to their closure at time $t_3$, switches $K_2$ and $K_3$ have a potential difference $V_{out}$ across their terminals, which induces losses when they close. Before they are closed at time $t_3$, switches $K_6$ and $K_7$ have a potential difference $(V_{in}-V_{pa})/2$, i.e. $(V_{in}-(V_{in}-2V_{out}))/2=V_{out}$ across their terminals, which leads to losses when they are closed.

In practice, if switches $K_2$ and $K_3$ have a reverse diode (intrinsic or additional diode in parallel), with regard to the sign of the current $I_L$, switches $K_2$ and $K_3$ do not need to be forced closed, but can close naturally a little later. In this case, the energy stored in their parasitic output capacitance will be dissipated in switches $K_6$ and $K_7$. In the common mode, if switches $K_2$ and $K_3$ are substantially identical and $K_6$ and $K_7$ are substantially identical, and switches $K_6$ and $K_7$ are closed at essentially the same time (likewise for switches $K_2$ and $K_3$ if they are commanded to forcibly close), then, due to symmetry, the current drawn on the potential $V_{inp}$ opposes the current drawn on the potential $V_{inn}$, and similarly for the potential $V_{outp}$ and the potential $V_{outn}$, and there is no common mode current injected on the output voltage $V_{out}$.

During this third phase III, with a substantially constant load, only switches $K_1$ and $K_4$ are in the on state or commanded into the closed position.

From time $t_3$ to time $t_4$, corresponding to a fourth phase IV, switches $K_2$, $K_3$, $K_6$ and $K_7$ are on or closed. The total piezoelectric voltage $V_p$ is equal to $V_{in}-V_{out}$. Positive power is drawn from the input voltage $V_{in}$ at the same time as positive power is supplied to the output voltage $V_{out}$.

From time $t_4$ to time $t_5$, corresponding to a fifth phase V, the sign of the current $I_L$ leads to a decrease in the total piezoelectric voltage $V_p$. The total piezoelectric voltage $V_p$ therefore changes from $+V_{in}-V_{out}$ to $-V_{in}-V_{out}$. Only the voltage $V_{pa}$ needs to be changed from $+V_{in}$ to $-V_{in}$, which it does naturally with the decrease of the total piezoelectric voltage $V_p$, while the voltage $V_{pb}$ remains constant and fixed at $-V_{out}$ by keeping the switches $K_2$ and $K_3$ on (either by maintaining a closing command, or naturally via their intrinsic reverse diode, or via an additional parallel diode).

During this fifth phase V, with a substantially constant load, only switches $K_2$ and $K_3$ are in the closed position.

At time $t_5$, the voltage $V_{pa}$ and the voltage $V_{pb}$ are thus already set to the values of the next voltage step, and switches $K_5$, $K_8$ are closed in ZVS mode. If the switches $K_5$ and $K_8$ have an intrinsic reverse diode or an additional diode in parallel, they can be switched on naturally according to the sign of the current. Switches $K_2$, $K_3$ were already on or closed.

From time $t_5$ to time $t_6$ (or time $t_0$), corresponding to a sixth phase VI, switches $K_2$, $K_3$, $K_5$ and $K_5$ are on or closed. The total piezoelectric voltage $V_p$ is equal to $-V_{in}-V_{out}$. Positive power is returned to the input voltage $V_{in}$ at the same time as positive power is supplied to the output voltage $V_{out}$.

Step-Down Configuration A2

The second step-down configuration A2 differs from the first step-down configuration A1, described above, only in that it incorporates a voltage swing $V_{ZVS}$ equal to $+V_{in}+V_{out}$ at time $t_3$. This voltage swing allows the transition from the total piezoelectric voltage level $V_p$ equal to $-V_{in}+V_{out}$ to the total piezoelectric voltage level $V_p$ equal to $V_{in}-V_{out}$ in ZVS switching at the switches.

This transition takes place in two steps, a first step from time $t_2$ to time $t_3$ to go from the total piezoelectric voltage $V_p$ equal to $-V_{in}+V_{out}$ to the total piezoelectric voltage $V_p$ equal to $V_{in}+V_{out}$, then a second step from time $t_3$ to time $t_{3b}$ to go from the total piezoelectric voltage $V_p$ equal to $V_{in}+V_{out}$ to the total piezoelectric voltage $V_p$ equal to $V_{in}-V_{out}$.

From time $t_2$ to time $t_3$, corresponding to the third step of the third phase III, the sign of the current $I_L$ leads to an increase in the total piezoelectric voltage $V_p$. The total piezoelectric voltage $V_p$ therefore changes from $-V_{in}+V_{out}$ to $V_{in}+V_{out}$. Only the voltage $V_{pa}$ needs to be changed from $-V_{in}$ to $+V_{in}$, which it does naturally with the increase of the total piezoelectric voltage $V_p$, while the voltage $V_{pb}$ remains constant and fixed at $+V_{out}$ by keeping the switches $K_1$ and $K_4$ on (either by maintaining a closing command, or naturally via their intrinsic reverse diode, or via an additional parallel diode).

During the first step of this third phase III, with a substantially constant load, only switches $K_1$ and $K_4$ are in the on state or commanded into the closed position.

At time $t_3$, the voltage $V_{pa}$ and the voltage $V_{pb}$ are therefore pre-positioned to $+V_{in}$ and $+V_{out}$ respectively, and the closing of switches $K_6$, $K_7$ takes place in ZVS mode. Switches $K_6$ and $K_7$ close, while switches $K_1$ and $K_4$ open.

From time $t_3$ to time $t_{3b}$, the sign of the current $I_L$ leads to a decrease in the total piezoelectric voltage $V_p$. The total piezoelectric voltage $V_p$ therefore changes from $V_{in}+V_{out}$ to $V_{in}-V_{out}$. Only the voltage $V_{pb}$ needs to be changed from $+V_{out}$ to $-V_{out}$, which it does naturally with the decrease of the total piezoelectric voltage $V_p$, while the voltage $V_{pa}$ remains constant and fixed at $+V_{in}$ by keeping the switches $K_6$ and $K_7$ closed.

During the second step of the third phase III, with a substantially constant load, only switches $K_6$ and $K_7$ are commanded into the closed position.

At time $t_{3b}$, the voltage $V_{pa}$ and the voltage $V_{pb}$ are thus already set to the values of the next voltage step, and switches $K_2$, $K_3$ are closed in ZVS mode. If the switches $K_2$ and $K_3$ have an intrinsic reverse diode or an additional diode in parallel, they can be switched on naturally according to the sign of the current. Switches $K_6$, $K_7$ were already closed. At the time $t_{3b}$, switches $K_2$ and $K_3$ close or turn on.

Step-Down Configuration A3

By convention, for the third step-down configuration A3, the highest voltage step for the total piezoelectric voltage $V_p$ is the one at value $V_c$. During this stage, power is delivered, or drawn, from the piezoelectric assemblies 12A, 12B. By convention, the current $I_L$ flowing in the piezoelectric elements 15, i.e. in the piezoelectric assemblies 12A, 12B, is oriented so as to be positive during this voltage step at value $V_c$. Therefore, at constant load, the total piezoelectric voltage $V_p$ tends to increase when the current $I_L$ is positive, and by extension, to decrease when the current $I_L$ is negative.

From time $t_0$ to time $t_1$, corresponding to a first phase I, the sign of the current $I_L$ leads to a decrease in the total piezoelectric voltage $V_p$. The total piezoelectric voltage $V_p$ thus changes from value $V_c$ equal to $V_{in}+V_{out}$ to value $V_b$ equal to $V_{in}-V_{out}$. Only the voltage $V_{pb}$ needs to be changed from $+V_{out}$ to $-V_{out}$, which it does naturally with the decrease of the total piezoelectric voltage $V_p$, while the voltage $V_{pa}$ remains constant and fixed at $+V_{in}$ by keeping the switches $K_6$ and $K_7$ closed.

During this first phase I, with a substantially constant load, only switches $K_6$ and $K_7$ are commanded into the closed position.

At time $t_1$, the voltage $V_{pa}$ and the voltage $V_{pb}$ are thus already set to the values of the next voltage step, and switches $K_2$, $K_3$ are closed in ZVS mode. If the switches $K_2$ and $K_3$ have an intrinsic reverse diode or an additional diode in parallel, they can be switched on naturally according to the sign of the current. Switches $K_6$, $K_7$ were already closed.

From time $t_1$ to time $t_2$, corresponding to the second phase II, switches $K_2$, $K_3$, $K_6$ and $K_7$ are on or closed. The total piezoelectric voltage $V_p$ is equal to $V_{in}-V_{out}$. Positive power is drawn from the input voltage $V_{in}$ at the same time as positive power is supplied to the output voltage $V_{out}$.

From time $t_2$ to time $t_3$, corresponding to the third phase III, the sign of the current $I_L$ leads to a decrease in the total piezoelectric voltage $V_p$. The total piezoelectric voltage $V_p$ therefore changes from $V_{IN}-V_{out}$ to $-V_{in}+V_{out}$. Seen from the piezoelectric assemblies 12A, 12B, applying the value $V_a$ at time $t_3$ does not induce a voltage variation across its terminals and from this point of view the closing of the switches at time $t_3$ does not induce losses for the piezoelectric assemblies 12A, 12B.

However, the voltage at the terminals of the switches is not zero and their closure induces losses due to the energy stored in their parasitic capacitances, for example their parasitic output capacitance. Indeed, the initial total piezoelectric voltage $V_p$ is $V_{IN}-V_{out}$, the voltage $V_{pa}$ being equal to $V_{in}$ and the voltage $V_{pb}$ equal to $-V_{out}$, and the sign of the current $I_L$ allows an decrease of the total piezoelectric voltage $V_p$ contributing to the decrease of the voltage $V_{pa}$, but not to the decrease of the voltage $V_{pb}$ which has to change from $-V_{out}$ to $+V_{out}$. Thus, at time $t_3$, the voltage $V_{pb}$ is still at $-V_{out}$ while the voltage $V_{pa}$ is equal to $V_p$ minus the voltage $V_{pb}$, i.e. $(-V_{in}+V_{out})-(-V_{out})=-V_{in}+2V_{out}$.

Prior to their closure at time $t_3$, switches $K_1$ and $K_4$ have a potential difference $V_{out}$ across their terminals, which induces losses when they close. Before they are closed at time $t_3$, switches $K_5$ and $K_8$ have a potential difference $(V_{in}+V_{pa})/2=(V_{in}+(-V_{in}+2V_{out}))/2=V_{out}$ across their terminals, which leads to losses when they are closed. In practice, if switches $K_1$ and $K_4$ have a reverse diode (intrinsic or additional diode in parallel), with regard to the sign of the current $I_L$, switches $K_1$ and $K_4$ do not need to be forced closed, but can close naturally a little later. In this case, the energy stored in their output capacitance will be dissipated in switches $K_5$ and $K_8$. In the common mode, if switches $K_1$ and $K_4$ are substantially identical and switches $K_5$ and $K_8$ are substantially identical, and switches $K_5$ and $K_8$ are closed at essentially the same time (likewise for switches $K_1$ and $K_4$ if they are commanded to forcibly close), then, due to symmetry, the current drawn on the potential $V_{inp}$ opposes the current drawn on the potential $V_{inn}$, and similarly for the potential $V_{outp}$ and the potential $V_{outn}$, and there is thus no common mode current injected on the output voltage $V_{out}$.

During this third phase III, with a substantially constant load, only switches $K_2$ and $K_3$ are in the on state or commanded into the closed position.

From time $t_3$ to time $t_4$, corresponding to the fourth phase IV, switches $K_1$, $K_4$, $K_5$ and $K_8$ are on or closed. The total piezoelectric voltage $V_p$ is equal to $-V_{in}+V_{out}$. Positive power is drawn from the input voltage $V_{in}$ at the same time as positive power is supplied to the output voltage $V_{out}$.

From time $t_4$ to time $t_5$, corresponding to the fifth phase V, the sign of the current $I_L$ leads to an increase in the total piezoelectric voltage $V_p$. The total piezoelectric voltage $V_p$ therefore changes from $-V_{in}+V_{out}$ to $V_{in}+V_{out}$. Only the voltage $V_{pa}$ needs to be changed from $-V_{in}$ to $+V_{in}$, which it does naturally with the increase of the total piezoelectric voltage $V_p$, while the voltage $V_{pb}$ remains constant and fixed at $+V_{out}$ by keeping the switches $K_1$ and $K_4$ on (either by maintaining a closing command, or naturally via their intrinsic reverse diode, or via an additional parallel diode).

During this fifth phase V, with a substantially constant load, only switches $K_1$ and $K_4$ are in the on state or commanded into the closed position.

At time $t_5$, the voltage $V_{pa}$ and the voltage $V_{pb}$ are thus already set to the values of the next voltage step, and switches $K_6$, $K_7$ are closed in ZVS mode. If the switches $K_5$ and $K_7$ have an intrinsic reverse diode or an additional diode in parallel, they can be switched on naturally according to the sign of the current. Switches $K_1$, $K_4$ were already on or closed.

From time $t_5$ to time $t_6$ (or time $t_0$), corresponding to the sixth phase VI, switches $K_1$, $K_4$, $K_6$ and $K_7$ are on or closed. The total piezoelectric voltage $V_p$ is equal to $V_{in}+V_{out}$. Positive power is returned to the input voltage $V_{in}$ at the same time as positive power is supplied to the output voltage $V_{out}$.

Step-Down Configuration A4

The fourth step-down configuration A4 differs from the third step-down configuration A3, described above, only in that it incorporates a voltage swing at $V_{ZVS}$ equal to $-V_{in}-V_{out}$ at time $t_3$. This voltage swing allows the transition from the total piezoelectric voltage level $V_p$ equal to $V_{in}-V_{out}$ to the total piezoelectric voltage level $V_p$ equal to $-V_{in}+V_{out}$ in ZVS switching at the switches.

This transition takes place in two steps, a first step from time $t_2$ to time $t_3$ to go from the total piezoelectric voltage $V_p$ equal to $V_{in}-V_{out}$ to the total piezoelectric voltage $V_p$ equal to $-V_{in}-V_{out}$, then a second step from time $t_3$ to time $t_{3b}$ to go from the total piezoelectric voltage $V_p$ equal to $-V_{in}-V_{out}$ to the total piezoelectric voltage $V_p$ equal to $-V_{in}+V_{out}$.

From time $t_2$ to time $t_3$, corresponding to the third phase III, the sign of the current $I_L$ leads to a decrease in the total piezoelectric voltage $V_p$. The total piezoelectric voltage $V_p$ therefore changes from $V_{in}-V_{out}$ to $-V_{in}-V_{out}$. Only the voltage $V_{pa}$ needs to be changed from $V_{in}$ to $-V_{in}$, which it does naturally with the increase of the total piezoelectric voltage $V_p$, while the voltage $V_{pb}$ remains constant and fixed at $-V_{out}$ by keeping the switches $K_2$ and $K_3$ on (either by maintaining a closing command, or naturally via their intrinsic reverse diode, or via an additional parallel diode).

During the first step of this third phase III, with a substantially constant load, only switches $K_2$ and $K_3$ are in the on state or commanded into the closed position.

At time $t_3$, the voltage $V_{pa}$ and the voltage $V_{pb}$ are therefore pre-positioned to $-V_{in}$ and $-V_{out}$ respectively, and the closing of switches $K_5$, $K_8$ takes place in ZVS mode.

At time $t_3$, switches $K_5$ and $K_8$ close, while switches $K_2$ and $K_3$ open.

From time $t_3$ to time $t_{3b}$, the sign of the current $I_L$ leads to an increase in the total piezoelectric voltage $V_p$. The total piezoelectric voltage $V_p$ therefore changes from $-V_{in}-V_{out}$ to $-V_{in}+V_{out}$. Only the voltage $V_{pb}$ needs to be changed, from $-V_{out}$ to $+V_{out}$, which it does naturally with the increase of the total piezoelectric voltage $V_p$, while the voltage $V_{pa}$ remains constant and fixed at $-V_{in}$ by keeping the switches $K_5$ and $K_8$ closed.

During the second step of the third phase III, with a substantially constant load, only switches $K_5$ and $K_8$ are commanded into the closed position.

At time $t_{3b}$, the voltage $V_{pa}$ and the voltage $V_{pb}$ are thus already set to the values of the next voltage step, and switches $K_1$, $K_4$ are closed in ZVS mode. If the switches $K_1$ and $K_4$ have an intrinsic reverse diode or an additional diode in parallel, they can be switched on naturally according to the sign of the current. Switches $K_5$, $K_8$ were already closed. At the time $t_{3b}$, switches $K_1$ and $K_4$ close or turn on.

The skilled person will observe that for the four step-down configurations of FIG. 2, the switches $K_1$, $K_2$, $K_3$, $K_4$ can each consist of a simple diode, their closing and opening then taking place naturally.

Figure 3:
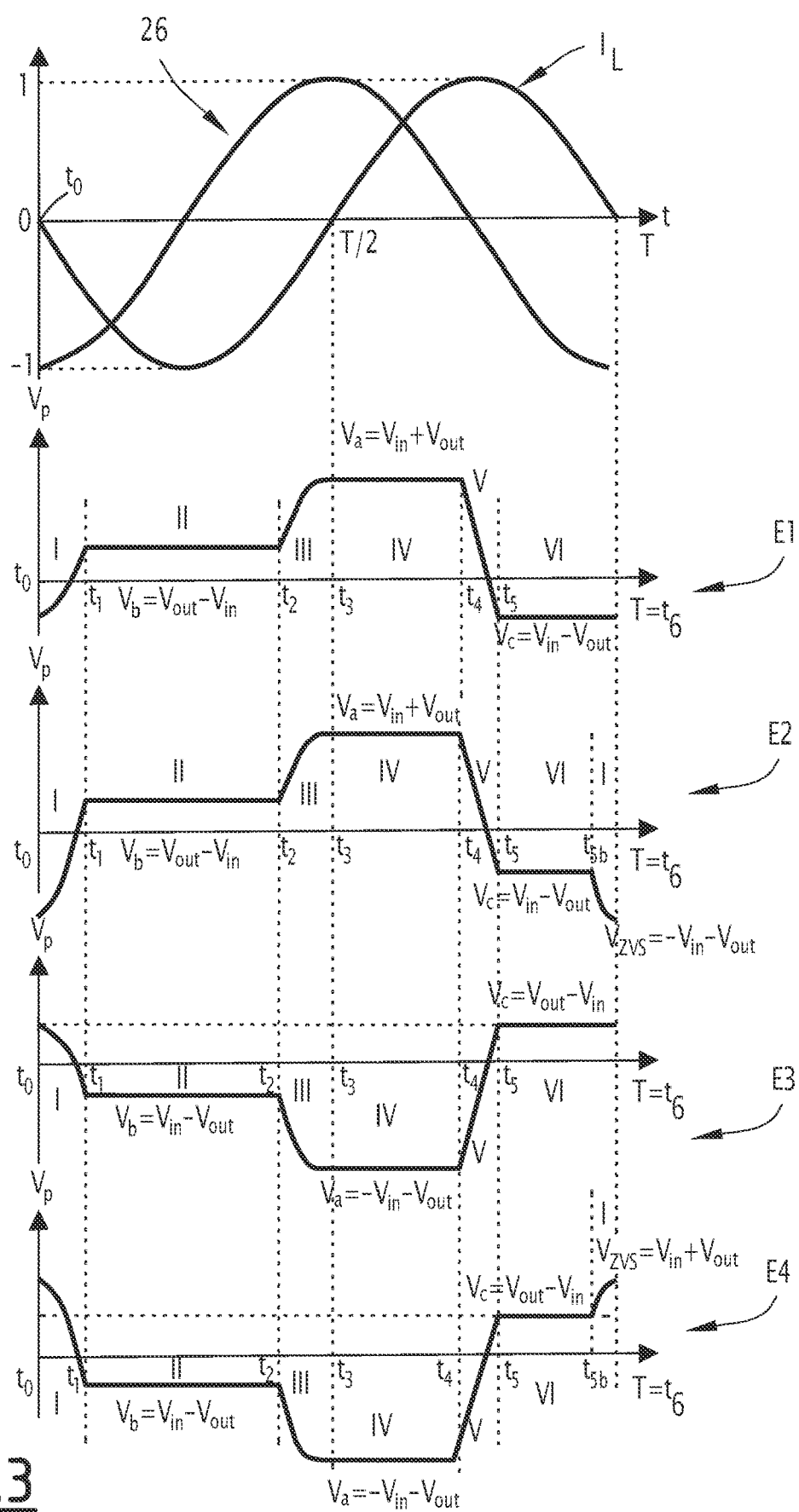
FIG. 3 is a similar view to FIG. 2, for other electrical energy conversion configurations, namely for four voltage step-up configurations.

The operation of the inverter 10 in the example of FIG. 1 is now explained according to the four step-up configurations, namely the first step-up configuration E1, the second step-up configuration E2, the third step-up configuration E3 and the fourth step-up configuration E4 as shown in FIG. 3.

Step-Up Configuration E1

From time $t_0$ to time $t_1$, corresponding to a first phase I, the sign of the current $I_L$ leads to an increase in the total piezoelectric voltage $V_p$. The total piezoelectric voltage $V_p$ thus changes from value $V_c$ equal to $V_{in}-V_{out}$ to value $V_b$ equal to $V_{in}+V_{out}$. Seen from the piezoelectric assemblies 12A, 12B, applying the value $V_b$ at time $t_1$ does not induce a voltage variation across its terminals and from this point of view the closing of the switches at time $t_1$ does not induce losses for the piezoelectric assemblies 12A, 12B.

However, the voltage at the terminals of the switches is not zero and their closure induces losses due to the energy stored in their parasitic capacitances, for example their parasitic output capacitance. Indeed, the initial total piezoelectric voltage $V_p$ is $V_{IN}-V_{out}$, namely the voltage $V_{pa}$ being equal to $V_{in}$ and the voltage $V_{pb}$ equal to $-V_{out}$, the sign of the current $I_L$ allows an increase of the total piezoelectric voltage $V_p$ and can therefore contribute to the increase of the voltage $V_{pb}$, but not to the decrease of the voltage $V_{pa}$ which has to change from $+V_{in}$ to $-V_{in}$. Thus, at time $t_1$, the voltage $V_{pa}$ is still at $+V_{in}$, while the voltage $V_{pb}$ is equal to $V_p$ minus the voltage $V_{pa}$, i.e. $(-V_{in}+V_{out})-V_{in}$ equal to $V_{out}-2V_{in}$. Prior to their closure at time $t_1$, switches $K_5$ and $K_8$ have a potential difference $V_{in}$ across their terminals, which induces losses when they close. Before they are closed at time $t_1$, switches $K_1$ and $K_4$ have a potential difference ($V_{out}$ minus the voltage $V_{pb}$)/2, i.e. $(V_{out}-(V_{out}-2V_{in}))/2$ equal to $V_{in}$ across their terminals, which leads to losses when they are closed.

In practice, if switches $K_1$ and $K_4$ have a reverse diode (intrinsic or additional diode in parallel), with regard to the sign of the current $I_L$, switches $K_1$ and $K_4$ do not need to be forced closed, but can close naturally a little later. In this case, the energy stored in their output capacitance will be dissipated in switches $K_5$ and $K_8$. In the common mode, if switches $K_1$ and $K_4$ are substantially identical and switches $K_5$ and $K_8$ are substantially identical, and switches $K_5$ and $K_8$ are closed at substantially the same time (likewise for switches $K_1$ and $K_4$ if they are commanded to forcibly close), then, due to symmetry, the current drawn on the potential $V_{inp}$ opposes the current drawn on the potential $V_{inn}$, and similarly for the potential $V_{outp}$ and the potential $V_{outn}$, and there is no common mode current injected on the output voltage $V_{out}$.

During this first phase I, with a substantially constant load, only switches $K_8$ and $K_7$ are on or commanded into the closed position. During this first phase I, the total piezoelectric voltage $V_p$ increases, which tends to increase the voltages $V_{pa}$ and $V_{pb}$, but as the voltage $V_{pa}$ is already equal to the value $+V_{in}$ at time $t_0$, it can no longer increase, which causes a small current to flow through the switches $K_6$ and $K_7$, either because they are closed or via their intrinsic or additional reverse diodes.

From time $t_1$ to time $t_2$, corresponding to the second phase II, switches $K_2$, $K_4$, $K_5$ and $K_8$ are on or closed. The total piezoelectric voltage $V_p$ is equal to $-V_{in}+V_{out}$. Positive power is drawn from the input voltage $V_{in}$ at the same time as positive power is supplied to the output voltage $V_{out}$.

From time $t_2$ to time $t_3$, corresponding to the third phase III, the sign of the current $I_L$ leads to an increase in the total piezoelectric voltage $V_p$. The total piezoelectric voltage $V_p$ therefore changes from $-V_{in}+V_{out}$ to $+V_{in}+V_{out}$. Only the voltage $V_{pa}$ needs to be changed, from $-V_{in}$ to $+V_{in}$, which it does naturally with the increase of the total piezoelectric voltage $V_p$, while the voltage $V_{pb}$ remains constant and fixed at $+V_{out}$ by keeping the switches $K_1$ and $K_4$ closed.

During this third phase III, with a substantially constant load, only switches $K_1$ and $K_4$ are commanded into the closed position.

At time $t_3$, the voltage $V_{pa}$ and the voltage $V_{pb}$ are thus already set to the values of the next voltage step, and switches $K_6$, $K_7$ are closed in ZVS mode.

From time $t_3$ to time $t_4$, corresponding to the fourth phase IV, switches $K_1$, $K_4$, $K_6$ and $K_7$ are closed. The total piezoelectric voltage $V_p$ is equal to $V_{in}+V_{out}$. Positive power is drawn from the input voltage $V_{in}$ at the same time as positive power is drawn from the output voltage $V_{out}$.

From time $t_4$ to time $t_5$, corresponding to the fifth phase V, the sign of the current $I_L$ leads to an increase in the total piezoelectric voltage $V_p$. The total piezoelectric voltage $V_p$ therefore changes from $+V_{in}+V_{out}$ to $+V_{in}-V_{out}$. Only the voltage $V_{pb}$ needs to be changed from $+V_{out}$ to $-V_{out}$, which it does naturally with the decrease of the total piezoelectric voltage $V_p$, while the voltage $V_{pa}$ remains constant and fixed at $+V_{in}$ by keeping the switches $K_6$ and $K_7$ closed.

During this fifth phase V, with a substantially constant load, only switches $K_6$ and $K_7$ are commanded into the closed position.

At time $t_5$, the voltage $V_{pa}$ and the voltage $V_{pb}$ are thus already set to the values of the next voltage step, and switches $K_2$, $K_3$ are closed in ZVS mode. If the switches $K_2$ and $K_3$ have an intrinsic reverse diode or an additional diode in parallel, they can be switched on naturally according to the sign of the current $I_L$. Switches $K_6$, $K_7$ were already closed.

From time $t_5$ to time $t_6$ (or time $t_0$), corresponding to the sixth phase VI, switches $K_6$, $K_7$, $K_2$ and $K_3$ are on or closed. The total piezoelectric voltage $V_p$ is equal to $V_{in}-V_{out}$. Positive power is drawn from the input voltage $V_{in}$ at the same time as positive power is supplied to the output voltage $V_{out}$.

Step-Up Configuration E2

The second step-up configuration E2 differs from the first step-up configuration E1, described above, only in that it incorporates a voltage swing at $V_{ZVS}$ equal to $-V_{in}-V_{out}$ at time to. This voltage swing allows the transition from the total piezoelectric voltage level $V_p$ equal to $V_{in}-V_{out}$ to the total piezoelectric voltage level $V_p$ equal to $-V_{in}+V_{out}$ in ZVS switching at the switches. This transition takes place in two steps, a first step from time $t_{5b}$ to time $t_6$ (or time $t_0$) to go from the total piezoelectric voltage $V_p$ equal to $V_{in}-V_{out}$ to the total piezoelectric voltage $V_p$ equal to $-V_{in}-V_{out}$, then a second step from time $t_0$ to time $t_1$ to go from the total piezoelectric voltage $V_p$ equal to $-V_{in}-V_{out}$ to the total piezoelectric voltage $V_p$ equal to $-V_{in}+V_{out}$.

From time $t_{5b}$ to time $t_6$ (or time $t_0$), the sign of the current $I_L$ leads to a decrease in the total piezoelectric voltage $V_p$. The total piezoelectric voltage $V_p$ therefore changes from $V_{in}-V_{out}$ to $-V_{in}-V_{out}$. Only the voltage $V_{pa}$ needs to be changed from $V_{in}$ to $-V_{in}$, which it does naturally with the increase of the total piezoelectric voltage $V_p$, while the voltage $V_{pb}$ remains constant and fixed at $-V_{out}$ by keeping the switches $K_2$ and $K_3$ on (either by maintaining a closing command, or naturally via their intrinsic reverse diode, or via an additional parallel diode). At time $t_6$ (or time $t_0$), the voltage $V_{pa}$ and the voltage $V_{pb}$ are therefore pre-positioned to $-V_{in}$ and $-V_{out}$ respectively, and the closing of switches $K_5$, $K_6$ takes place in ZVS mode.

During the first step of this first phase I, with a substantially constant load, only switches $K_2$ and $K_3$ are in the on state or commanded into the closed position.

At time $t_0$, switches $K_5$ and $K_8$ close, while switches $K_2$ and $K_3$ open.

From time $t_0$ to time $t_1$, corresponding to a first phase I, the sign of the current $I_L$ leads to an increase in the total piezoelectric voltage $V_p$. The total piezoelectric voltage $V_p$ therefore changes from $-V_{in}-V_{out}$ to $-V_{in}+V_{out}$. Only the voltage $V_{pb}$ needs to be changed, from $-V_{out}$ to $+V_{out}$, which it does naturally with the increase of the total piezoelectric voltage $V_p$, while the voltage $V_{pa}$ remains constant and fixed at $-V_{in}$ by keeping the switches $K_5$ and $K_8$ closed.

During the second step of this first phase I, with a substantially constant load, only switches $K_5$ and $K_8$ are commanded into the closed position.

At time $t_1$, the voltage $V_{pa}$ and the voltage $V_{pb}$ are thus already set to the values of the next voltage step, and switches $K_1$, $K_4$ are closed in ZVS mode. If the switches $K_1$ and $K_4$ have an intrinsic reverse diode or an additional diode in parallel, they can be switched on naturally according to the sign of the current. Switches $K_5$, $K_8$ were already closed.

At time $t_1$, switches $K_1$ and $K_4$ close or turn on.

Step-Up Configuration E3

From time $t_0$ to time $t_1$, corresponding to a first phase I, the sign of the current $I_L$ leads to a decrease in the total piezoelectric voltage $V_p$. The total piezoelectric voltage $V_p$ thus changes from value $V_c$ equal to $-V_{in}+V_{out}$ to value $V_b$ equal to $V_{in}-V_{out}$. Seen from the piezoelectric assemblies 12A, 12B, applying the value $V_b$ at time $t_1$ does not induce a voltage variation across its terminals and from this point of view the closing of the switches at time $t_1$ does not induce losses for the piezoelectric assemblies 12A, 12B.

However, the voltage at the terminals of the switches is not zero and their closure induces losses due to the energy stored in their parasitic capacitances, for example their parasitic output capacitance. Indeed, the initial total piezoelectric voltage $V_p$ is $-V_{in}+V_{out}$, the voltage $V_{pa}$ being equal to $-V_{in}$ and the voltage $V_{pb}$ equal to $+V_{out}$, and the sign of the current $I_L$ allows an decrease of the total piezoelectric voltage $V_p$, contributing to the decrease of the voltage $V_{pb}$, but not to the increase of the voltage $V_{pa}$ which has to change from $-V_{in}$ to $+V_{in}$. Thus, at time $t_1$, the voltage $V_{pa}$ is still at $-V_{in}$ while the voltage $V_{pb}$ is equal to $V_p$ minus the voltage $V_{pa}$ equal to $(V_{in}-V_{out})-(-V_{in})$, i.e. $2V_{in}-V_{out}$.

Prior to their closure at time $t_1$, switches $K_6$ and $K_7$ have a potential difference $V_{in}$ across their terminals, which induces losses when they close. Before they are closed at time $t_1$, switches $K_2$ and $K_3$ have a potential difference ($V_{out}$ plus the voltage $V_{pb}$)/2, i.e. $(V_{out}+(2V_n-V_{out}))/2$ equal to $V_{in}$ across their terminals, which leads to losses when they are closed.

In practice, if switches $K_2$ and $K_3$ have a reverse diode (intrinsic or additional in parallel), with regard to the sign of the current $I_L$. Switches $K_2$ and $K_3$ do not need to be forced closed, but can close naturally at a later time. In this case, the energy stored in their output capacitance will be dissipated in switches $K_6$ and $K_7$ when they are closed.

In the common mode, if switches $K_2$ and $K_3$ are substantially identical and switches $K_6$ and $K_7$ are substantially identical, and switches $K_6$ and $K_7$ are closed at substantially the same time (likewise for switches $K_2$ and $K_3$ if they are commanded to forcibly close), then, due to symmetry, the current drawn on the potential $V_{inp}$ opposes the current drawn on the potential $V_{inn}$, and likewise for the potential $V_{outp}$ and the potential $V_{outn}$, and there is no common mode current injected on the output voltage $V_{out}$.

During this first phase I, with a substantially constant load, only switches $K_5$ and $K_8$ are on or commanded into the closed position. During this first phase I, the total piezoelectric voltage $V_p$ decreases, which tends to decrease the voltages $V_{pa}$ and $V_{pb}$, but as the voltage $V_{pa}$ is already equal to the value $-V_{in}$ at time $t_0$, it can no longer decrease, which causes a small current to flow through the switches $K_5$ and $K_8$, either because they are closed or via their intrinsic or additional reverse diodes.

From time $t_1$ to time $t_2$, corresponding to the second phase II, switches $K_2$, $K_3$, $K_6$ and $K_7$ are on or closed. The total piezoelectric voltage $V_p$ is equal to $V_{IN}-V_{out}$. Positive power is drawn from the input voltage $V_{in}$ at the same time as positive power is supplied to the output voltage $V_{out}$.

From time $t_2$ to time $t_3$, corresponding to the third phase III, the sign of the current $I_L$ leads to a decrease in the total piezoelectric voltage $V_p$. The total piezoelectric voltage $V_p$ therefore changes from $V_{in}-V_{out}$ to $-V_{in}-V_{out}$. Only the voltage $V_{pa}$ needs to be changed, from $+V_{in}$ to $-V_{in}$, which it does naturally with the decrease of the total piezoelectric voltage $V_p$, while the voltage $V_{pb}$ remains constant and fixed at $-V_{out}$ by keeping the switches $K_2$ and $K_3$ closed or on.

During this third phase III, with a substantially constant load, only switches $K_2$ and $K_3$ are in the on state or commanded into the closed position.

At time $t_3$, the voltage $V_{pa}$ and the voltage $V_{pb}$ are thus already set to the values of the next voltage step, and switches $K_5$, $K_8$ are closed in ZVS mode.

From time $t_3$ to time $t_4$, corresponding to the fourth phase IV, switches $K_2$, $K_3$, $K_5$ and $K_8$ are on or closed. The total piezoelectric voltage $V_p$ is equal to $-V_{in}-V_{out}$. Positive power is drawn from the input voltage $V_{in}$ at the same time as positive power is also drawn from the output voltage $V_{out}$.

From time $t_4$ to time $t_5$, corresponding to the fifth phase V, the sign of the current $I_L$ leads to an increase in the total piezoelectric voltage $V_p$. The total piezoelectric voltage $V_p$ therefore changes from $-V_{in}-V_{out}$ to $-V_{in}+V_{out}$. Only the voltage $V_{pb}$ needs to be changed, from $-V_{out}$ to $+V_{out}$, which it does naturally with the increase of the total piezoelectric voltage $V_p$, while the voltage $V_{pa}$ remains constant and fixed at $-V_{in}$ by keeping the switches $K_5$ and $K_8$ closed.

During this fifth phase V, with a substantially constant load, only switches $K_5$ and $K_8$ are commanded into the closed position.

At time $t_5$, the voltage $V_{pa}$ and the voltage $V_{pb}$ are thus already set to the values of the next voltage step, and switches $K_1$, $K_4$ are closed in ZVS mode. If the switches K, and $K_4$ have an intrinsic reverse diode or an additional diode in parallel, they can be switched on naturally according to the sign of the current. Switches $K_5$, $K_8$ were already closed.

From time $t_5$ to time $t_6$ (or time $t_0$), corresponding to the sixth phase VI, switches $K_1$, $K_4$, $K_5$ and $K_8$ are on or closed. The total piezoelectric voltage $V_p$ is equal to $-V_{in}+V_{out}$. Positive power is drawn from the input voltage $V_{in}$ at the same time as positive power is supplied to the output voltage $V_{out}$.

Step-Up Configuration E4

The fourth step-up configuration E4 differs from the third step-up configuration E3, described above, only in that it incorporates a voltage swing at $V_{ZVS}$ equal to $+V_{in}+V_{out}$ at time $t_0$. This voltage swing allows the transition from the total piezoelectric voltage level $V_p$ equal to $-V_{in}+V_{out}$ to the total piezoelectric voltage level $V_p$ equal to $V_{in}-V_{out}$ in ZVS switching at the switches. This transition takes place in two steps, a first step from time $t_{5b}$ to time $t_6$ (or time $t_0$) to go from the total piezoelectric voltage $V_p$ equal to $-V_{in}+V_{out}$ to the total piezoelectric voltage $V_p$ equal to $+V_{in}+V_{out}$, then a second step from time $t_0$ to time $t_1$ to go from the total piezoelectric voltage $V_p$ equal to $V_{in}+V_{out}$ to the total piezoelectric voltage $V_p$ equal to $V_{in}+V_{out}$.

From time $t_{5b}$ to time $t_6$ (or time $t_0$), the sign of the current $I_L$ leads to an increase in the total piezoelectric voltage $V_p$. The total piezoelectric voltage $V_p$ therefore changes from $-V_{in}+V_{out}$ to $V_{in}+V_{out}$. Only the voltage $V_{pa}$ needs to be changed from $-V_{in}$ to $V_{in}$, which it does naturally with the increase of the total piezoelectric voltage $V_p$, while the voltage $V_{pb}$ remains constant and fixed at $V_{out}$ by keeping the switches $K_1$ and $K_4$ on (either by maintaining a closing command, or naturally via their intrinsic reverse diode, or via an additional parallel diode).

During the first step of this first phase I, with a substantially constant load, only switches $K_1$ and $K_4$ are commanded into the closed position.

At time $t_6$ (or time $t_0$), the voltage $V_{pa}$ and the voltage $V_{pb}$ are therefore pre-positioned to $V_{in}$ and $V_{out}$ respectively, and the closing of switches $K_6$, $K_7$ takes place in ZVS mode. At time $t_0$, switches $K_6$ and $K_7$ close, while switches $K_1$ and $K_4$ open.

From time $t_0$ to time $t_1$, corresponding to the second step of the first phase I, the sign of the current $I_L$ leads to a decrease in the total piezoelectric voltage $V_p$. The total piezoelectric voltage $V_p$ therefore changes from $V_{in}+V_{out}$ to $V_{in}-V_{out}$. Only the voltage $V_{pb}$ needs to be changed, from $V_{out}$ to $-V_{out}$, which it does naturally with the decrease of the total piezoelectric voltage $V_p$, while the voltage $V_{pa}$ remains constant and fixed at $+V_{in}$ by keeping the switches $K_6$ and $K_7$ closed.

During the second step of this first phase I, with a substantially constant load, only switches $K_6$ and $K_7$ are commanded into the closed position.

At time $t_1$, the voltage $V_{pa}$ and the voltage $V_{pb}$ are thus already set to the values of the next voltage step, and switches $K_2$, $K_3$ are closed in ZVS mode. If the switches $K_2$ and $K_3$ have an intrinsic reverse diode or an additional diode in parallel, they can be switched on naturally according to the sign of the current. Switches $K_6$, $K_7$ were already closed. At time $t_1$, switches $K_2$ and $K_3$ close or turn on.

The skilled person will observe that for the first and second step-up configurations E1 and E2 of FIG. 3, the switches $K_2$ and $K_3$ can be simple diodes that open and close naturally. Likewise, for the third and fourth step-up configurations E3 and E4 of FIG. 3, the switches $K_1$ and $K_4$ can be simple diodes that open and close naturally.

As an optional addition, in the examples of FIGS. 5 to 9, the converter 10 further comprises at least one switching aid circuit 50, each switching aid circuit 50 being connected to a respective one of the first 38 and second 48 midpoints, each switching aid circuit 50 being configured to, via the flow of a previously received current, discharge a parasitic capacitance of a switch 36, 46 of the respective switching bridge 30, 40 to which it is connected, and respectively charge a parasitic capacitance of another switch 36, 46 of said switching bridge 30, 40.

In the examples of FIGS. 5 and 8, the converter 10 comprises a single switching aid circuit 50 connected to either the first switching bridge 30 or the second switching bridge 40. In the example shown in FIG. 5, the single switching aid circuit 50 is connected to the second switching bridge 40. In the example shown in FIG. 8, the single switching aid circuit 50 is connected to the first switching bridge 30.

In the examples of FIGS. 5 and 8, the second switching bridge 40 has two second switching branches 42, respectively the first switching bridge 30 has two first switching branches 32; and the switching aid circuit 50 is connected between the respective midpoints 38, 48 of the two switching branches 32, 42 of said bridge 30, 40. In the example shown in FIG. 5, the switching aid circuit 50 is connected between the second midpoints 48 of the two second switching branches 42 of the second switching bridge 40. Likewise, in the example shown in FIG. 8, the switching aid circuit 50 is connected between the first midpoints 38 of the two first switching branches 32 of the first switching bridge 30.

Alternatively, not shown, the converter 10 comprises two switching aid circuits 50, a first switching aid circuit being connected to the first switching bridge 30 and a second switching aid circuit being connected to the second switching bridge 40.

In this alternative, the skilled person will understand that each switching aid circuit 50 is capable of being connected between the respective midpoints 38, 48 of the two switching branches 32, 42.

Each switching aid circuit 50 is configured, via the flow of a previously received current $I_{CALC}$, to discharge at least one parasitic capacitance of a switch 36, 46, preferably a switch to be closed, of the respective switching bridge 30, 40 to which it is connected; respectively to charge at least one parasitic capacitance of another switch 36, 46, preferably a switch to be opened or kept open, of said switching bridge 30, 40.

Each of the switches of said switching bridge 30 is opened when the previously received current flows through the switching aid circuit 50.

As a result of this current flow, the switch(es) 36, 46 whose parasitic capacitance has been discharged by the switching aid circuit 50 is/are closed. The other switch(es) 36, 46 whose parasitic capacitance has been charged by the switching aid circuit 50 remain(s) open.

Figure 6:
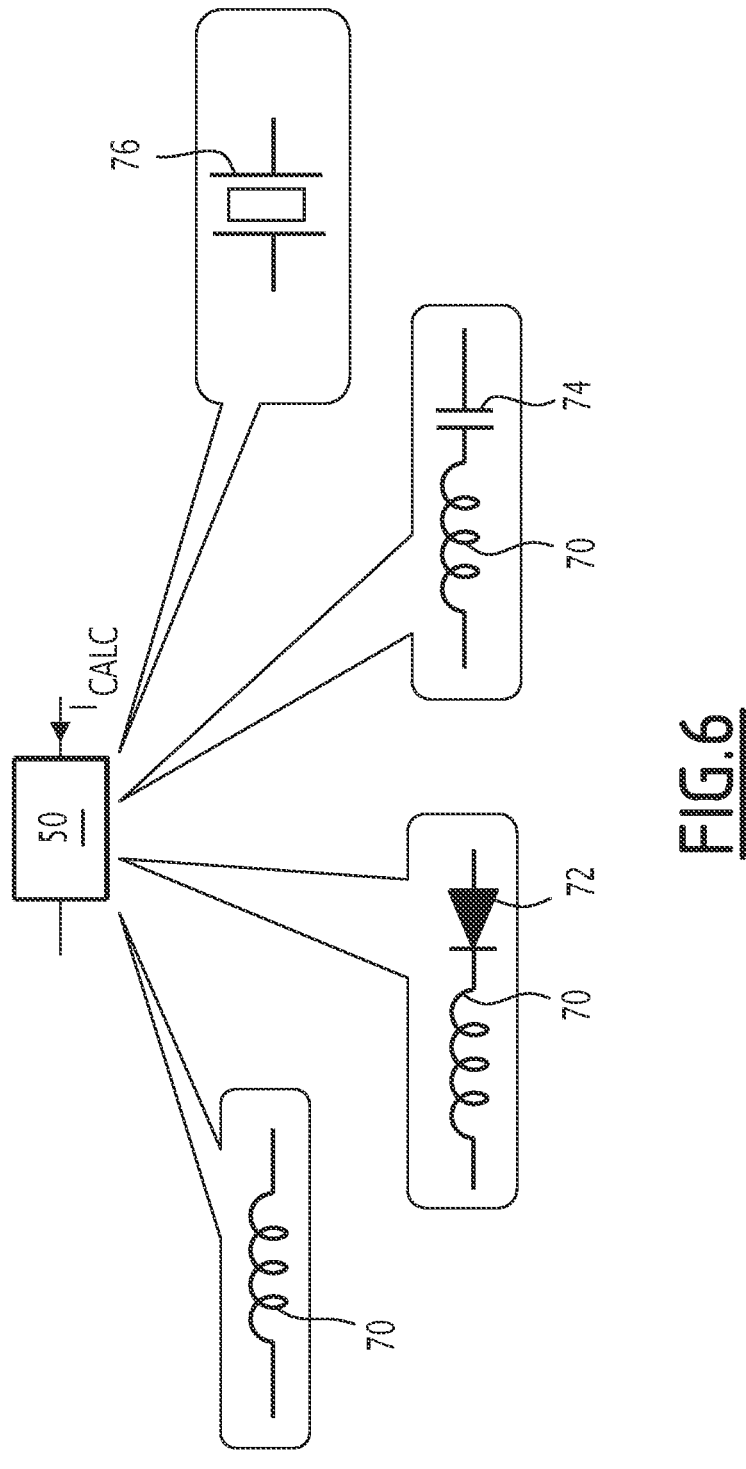
FIG. 6 is a schematic representation of different types of switching support circuits.

Each switching aid circuit 50 comprises, for example, an inductor 70; or a first assembly of the inductor 70 and a diode 72 connected in series; or a second assembly of the inductor 70 and a capacitor 74 connected in series; or an additional piezoelectric element 76, as shown in FIG. 6.

Each switching aid circuit 50 is for example an inductor 70, the inductor 70 preferably consisting of a coil and a magnetic circuit. Alternatively, each switching aid circuit 50 is in the form of the first assembly of series-connected inductor 70 and diode 72, and preferably consists of said first assembly of inductor 70 and diode 72. In yet another alternative, each switching aid circuit 50 is in the form of the second assembly of series-connected inductor 70 and capacitor 74, and preferably consists of said first assembly of inductor 70 and capacitor 74. Alternatively, each switching aid circuit 50 is in the form of the additional piezoelectric element 76, and preferably consists of the additional piezoelectric element 76.

In the embodiment where the switching aid circuit 50 is in the form of the inductor 70 alone, the inductor 70 has its current increase over a half-period, i.e. when the voltage across it is positive; and then its current decrease over the other half-period, i.e. when the voltage across it is negative. This embodiment of the switching aid circuit 50 preferably requires that the voltage across the terminals of the inductor 70 be substantially zero on average, otherwise there is a risk of current drift. If the switching aid circuit 50 is connected to the second bridge 40, in particular between the second midpoints 48, the voltage across the terminals of the inductor 70 is the voltage $V_{pb}$. By extension, the switching aid circuit 50 is connected to the first bridge 30, in particular between the first midpoints 38, the voltage across the terminals of the inductor 70 is the voltage $V_{pa}$.

The variant where the switching aid circuit 50 is in the form of the inductor 70 and the diode 72 connected in series, allows the inductor 70 to be charged only over half a period with the correct polarity, in particular for cycles where the current $I_{CALC}$ is received during a time period with only one polarity, for example between the times $t_2$ and $t_3$ for the step-down cycles A1_C and A3_C described below (positive polarity of the current $I_{CALC}$ for the step-down cycle A1_C between the times $t_2$ and $t_3$, negative polarity for the step-down cycle A3_C between these times $t_2$ and $t_3$). In particular, the diode 72 then avoids charging the inductor 70 with a reverse current between the times t3 and T. This unidirectional current operation also reduces the effective current seen by the inductor 70 and therefore the losses. Furthermore, the switching aid circuit 50 according to this variant is not sensitive to the presence of a DC component as long as the DC component is in the direction of blocking the diode 72.

The variant where the switching aid circuit 50 is in the form of the inductor 70 and the capacitor 74 connected in series, makes it possible—compared to the example of the inductor 70 alone—to reduce or even eliminate a possible DC component. Nevertheless, the 74 capacitor can be quite large. Indeed, the voltage at the terminals of the capacitor 74 must change little, i.e. in a small proportion, compared to the input voltage $V_{in}$ or the output voltage $V_{out}$, for example have an amplitude of less than 50% of the input voltage $V_{in}$ or output voltage $V_{out}$.

According to the variant where the switching aid circuit 50 is in the form of the additional piezoelectric element 76, from the moment the converter 10 is controlled between the resonance and anti-resonance frequency of the additional piezoelectric element 76, the latter starts to oscillate and to produce a current $I_{CALC}$ substantially in quadrature with the voltage at its terminals, such as the voltage $V_{pb}$ if the additional piezoelectric element 76 is connected to the second bridge 40 between the second midpoints 48, or the voltage $V_{pa}$ if the additional piezoelectric element 76 is connected to the first bridge 30 between the first midpoints 38. The current $I_{CALC}$ then passes through an extrema around the time t3 for the step-down cycles A1_C and A3_C, which ensures the voltage inversion function $V_{pb}$ between the times $t_2$ and $t_3$; or similarly around the time $t_0$ for the step-up cycles E1_C and E3_C described below in relation to FIG. 9, which ensures the voltage inversion function $V_{pa}$ between the times $t_0$ and $t_1$.

The additional piezoelectric element 76 is typically at least 3 times smaller than the piezoelectric element(s) 15 of the converter 10, the additional piezoelectric element 76 only having to charge/discharge the parasitic capacitances of the switches 36, 46. The parasitic capacitance of the switches 36, 46 is indeed considered to be at least three times lower than the reference capacitance $C_0$ of the piezoelectric element(s) 15 of the converter 10. This variant where the switching aid circuit 50 is in the form of the additional piezoelectric element 76 is insensitive to any DC component (regardless of its polarity), and the switching aid circuit 50 is suitable for connection to both the first bridge 30 (voltage $V_{pa}$) and the second bridge 40 (voltage $V_{pb}$).

In other words, the reference capacitance of the additional piezoelectric element 76 is at least three times less than the reference capacitance $C_0$ of each piezoelectric assembly 12 connected between respective first 38 and second 48 midpoints.

Figure 7:
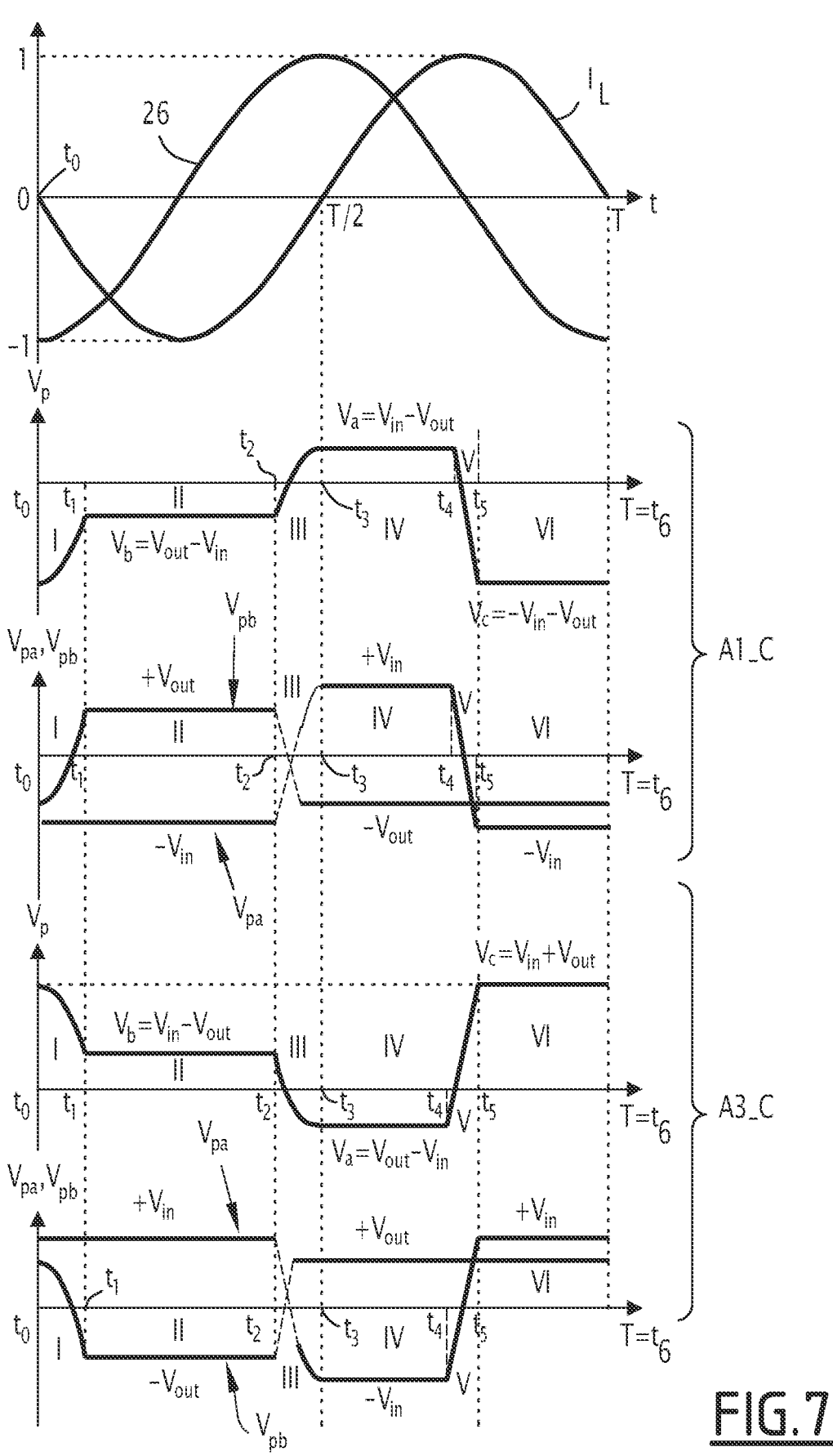
FIG. 7 is a view similar to FIG. 2, in the complementary aspect of FIG. 5, with the set of curves further representing the sum of the elementary voltages across each piezoelectric assembly, for two step-down configurations.

The operation of the converter 10 in the example of FIG. 5 will now be explained according to two step-down configurations, namely a first step-down configuration A1_C and a second step-down configuration A3_C as shown in FIG. 7. The difference resulting from the switching aid circuit 50 according to the complementary aspect relates to the changes in the voltages $V_{pa}$ and $V_{pb}$ between the times $t_2$ and $t_3$ in the case of these step-down configurations A1_C, A3_C, and more particularly to the areas shown as dotted lines in FIG. 7 to mark the difference.

The conversion cycle of the converter 10 according to the complementary aspect is described below for the first A1_C and second A3_C step-down configurations, focusing on the differences with respect to the conversion cycle of the converter 10 of FIG. 1 for the same step-down configurations A1 and A3.

For the first step-down configuration A1_C, between the times $t_1$ and $t_2$, according to the example of the switching aid circuit 50, the inductor 70 or the additional piezoelectric element 76 sees its current $I_{CALC}$ increase, under the voltage $V_{pb}$ equal to $+V_{out}$. At time $t_2$, the current $I_{CALC}$ is positive.

Just before time $t_2$, the total piezoelectric voltage $V_p$ is equal to $-V_{in}+V_{out}$, the voltage $V_{pa}$ being equal to $-V_{in}$, and the voltage $V_{pb}$ being equal to $+V_{out}$; and the switches $K_5$, $K_8$, $K_1$, $K_4$ are closed.

At time $t_2$, all switches that were closed open. The current $I_{CALC}$ then charges the parasitic capacitances of switches $K_1$, $K_4$, while discharging the parasitic capacitances of switches $K_2$ and $K_3$. Similarly, through the slowly evolving piezo-electric assemblies 12, the current $I_{CALC}$ partially charges the parasitic capacitances of switches $K_5$, $K_8$, while partially discharging the parasitic capacitances of switches $K_6$, $K_7$. The voltage $V_{pb}$ thus changes from $+V_{out}$ to $-V_{out}$, while the voltage $V_{pa}$ changes substantially from $-V_{in}$ to $-V_{in}+2V_{out}$ plus the change of the total piezoelectric voltage $V_p$ since time $t_2$.

The voltage inversion $V_{pb}$ is considered completed before the total piezoelectric voltage $V_p$ reaches the next step $V_a$. Indeed, even if the amplitude of the current $I_{CALC}$ in the switching aid circuit 50 is much smaller than the amplitude of the internal current $I_L$ of the piezoelectric elements 15 (for example at least 3 times smaller to limit its size), it never-theless only has to charge/discharge the parasitic capaci-tances of the switches 36, 46 considered much smaller than the reference capacitance $C_0$ of the piezoelectric elements 15 (at least a factor of 3). Furthermore, the current $I_{CALC}$ in the switching aid circuit 50 approaches its maximum value at time $t_3$, while the internal current $I_L$ approaches 0 at said time $t_3$.

Once complete reversal of the voltage $V_{pb}$ is reached (from $V_{out}$ to $-V_{out}$), then switches $K_2$ and $K_3$ are closed so that the voltage $V_{pb}$ is fixed, while the voltage $V_{pa}$ continues to rise to $V_{in}$ due to the natural increase in the total piezoelectric voltage $V_p$.

At time $t_3$, switches $K_6$ and $K_7$ are closed. Switches $K_2$ and $K_3$ are also closed if this has not been done already, i.e. if the voltage $V_{pb}$ has not yet reached $-V_{out}$.

In addition, if the switches $K_2$ and $K_3$ ave an intrinsic reverse diode or an additional diode in parallel, they can be switched on naturally according to the sign of the internal current $I_L$ after time $t_3$, or according to the residual $I_{CALC}$ current before time $t_3$.

The remainder of the conversion cycle of the converter 10 according to the complementary aspect remains substan-tially unchanged from the conversion cycle of the converter 10 of FIG. 1.

The voltage swing of the total piezoelectric voltage $V_p$ is thus limited between the times $t_2$ and $t_4$, ranging from $-V_{in}+V_{out}$ to $V_{in}-V_{out}$, instead of from $-V_{in}+V_{out}$ to $+V_{in}+V_{out}$ with the converter 10 of FIG. 1 (in the case of the step-down configuration A2 to ensure zero-voltage switching of switches 36, 46), i.e. a swing of $2V_{in}-2V_{out}$ instead of $2V_{in}$, while ensuring zero-voltage switching of switches 36, 46.

For the second step-down configuration A3_C, between the times $t_1$ and $t_2$, according to the example of the switching aid circuit 50, the inductor 70 or the additional piezoelectric element 76 sees its current $I_{CALC}$ decrease, under the voltage $V_{pb}$ equal to $-V_{out}$. At time $t_2$, the current $I_{CALC}$ is negative.

Just before time $t_2$, the total piezoelectric voltage $V_p$ is equal to $V_{in}-V_{out}$, the voltage $V_{pa}$ being equal to $V_{in}$, and the voltage $V_{pb}$ being equal to $-V_{out}$; and the switches $K_6$, $K_7$, $K_2$, $K_3$ are closed.

At time $t_2$, all switches that were closed open. The current $I_{CALC}$ then charges the parasitic capacitances of switches $K_2$, $K_3$, while discharging the parasitic capacitances of switches $K_1$ and $K_4$. Similarly, through the slowly evolving piezo-electric assemblies 12, the current $I_{CALC}$ partially charges the parasitic capacitances of switches $K_6$, $K_7$, while partially discharging the parasitic capacitances of switches $K_5$, $K_8$. The voltage $V_{pb}$ thus changes from $-V_{out}$ to $+V_{out}$, while the voltage $V_{pa}$ changes substantially from $+V_{in}$ to $+V_{in}-2V_{out}$ plus the change of the total piezoelectric voltage $V_p$ since time $t_2$.

The voltage inversion $V_{pb}$ is considered completed before the total piezoelectric voltage $V_p$ reaches the next step $V_a$. Indeed, even if the amplitude of the current $I_{CALC}$ in the switching aid circuit 50 is much smaller than the amplitude of the internal current $I_L$ of the piezoelectric elements 15 (for example at least 3 times smaller to limit its size), it never-theless only has to charge/discharge the parasitic capaci-tances of the switches 36, 46 considered much smaller than the reference capacitance $C_0$ of the piezoelectric elements 15 (at least a factor of 3). Furthermore, the current $I_{CALC}$ in the switching aid circuit 50 approaches its maximum value (its negative extreme) at time $t_3$, while the internal current $I_L$ approaches 0 at said time $t_3$.

Once complete reversal of the voltage $V_{pb}$ is reached (from $-V_{out}$ to $+V_{out}$), then switches $K_1$ and $K_4$ are closed so that the voltage $V_{pb}$ is fixed, while the voltage $V_{pa}$ continues to rise to $-V_{in}$ due to the natural decrease in the total piezoelectric voltage $V_p$.

At time $t_3$, switches $K_5$ and $K_8$ are closed. Switches $K_1$ and $K_4$ are also closed if this has not been done already, i.e. if the voltage $V_{pb}$ has not yet reached $+V_{out}$.

In addition, if the switches $K_1$ and $K_4$ have an intrinsic reverse diode or an additional diode in parallel, they can be switched on naturally according to the sign of the internal current $I_L$ after time $t_3$, or according to the residual $I_{CALC}$ current before time $t_3$.

The remainder of the conversion cycle of the converter 10 of FIG. 5 remains substantially unchanged from the conver-sion cycle of the converter 10 of FIG. 1.

Once again, the voltage swing of the total piezoelectric voltage $V_p$ is thus limited between the times $t_2$ and $t_4$, ranging from $V_{in}-V_{out}$ to $V_{out}-V_{in}$, instead of from $-V_{in}-V_{out}$ to $-V_{in}-V_{out}$ with the converter 10 of FIG. 1 (in the case of the step-down configuration A4 to ensure zero-voltage switching of switches 36, 46), i.e. a swing of $2V_{in}-2V_{out}$ instead of $2V_{in}$, while ensuring zero-voltage switching of switches 36, 46.

Figure 9:
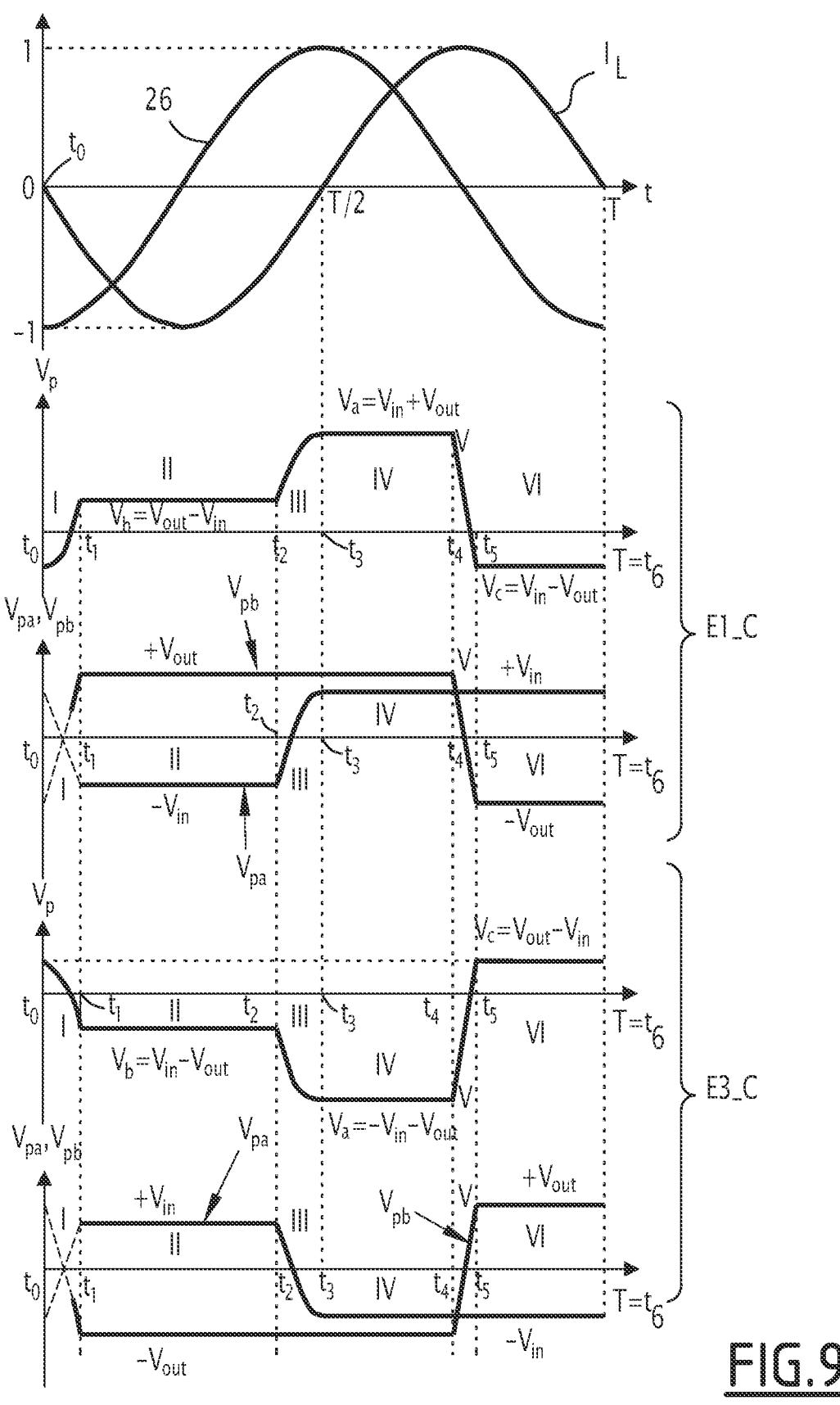
FIG. 9 is a similar view to FIG. 7, for other electrical energy conversion configurations, namely for two voltage step-up configurations, typically according to the alternative embodiment of the complementary aspect.

FIGS. 8 and 9 illustrate an alternative embodiment of the converter 10 in which the switching aid circuit 50 is con-nected to the first switching bridge 30, for example between the first midpoints 38 of the first two switching branches 32.

According to this alternative embodiment of the converter 10, the difference from the previously described embodi-ment of FIGS. 5 and 7 is that the switching aid circuit 50 is then connected to the first switching bridge 30 instead of being connected to the second switching bridge 40 according to the embodiment of FIGS. 5 and 7. The other elements which are unchanged between the embodiment of FIGS. 5 and 7, and this variant of FIGS. 8 and 9 is repeated with identical references.

The operation of the converter 10 in the example of FIG. 8 will now be explained according to two step-up configurations, namely a first step-up configuration E1_C and a second step-up configuration E3_C as shown in FIG. 9. The difference resulting from the switching aid circuit 50 according to this complementary aspect relates to the changes in the voltages $V_{pa}$ and $V_{pb}$ between the times $t_0$ and $t_1$ in the case of these step-up configurations E1_C, E3_C, and more particularly to the areas shown as dotted lines in FIG. 9 to mark the difference.

The conversion cycle of the converter 10 according to the complementary aspect is described below for the first E1_C and second E3_C step-up configurations, focusing on the differences with respect to the conversion cycle of the converter 10 of FIG. 1 for the same step-up configurations.

For the previously described step-down configurations A1_C and A3_C, it was the voltage $V_{pb}$ that had a homogeneous polarity on each of the two half-periods with a polarity inversion between the two half-periods, and it was therefore preferable to have the switching aid circuit 50 on the $V_{pb}$ side, i.e. connected to the second switching bridge 40, between the respective second midpoints 48.

This time, for these step-up configurations E1_C and E3_C, it is the voltage $V_{pa}$ that has a homogeneous polarity on each of the two half-periods with a polarity inversion between the two half-periods (same polarity on the $V_a$ and $V_c$ steps and opposite polarity on the step $V_b$). For these step-up configurations E1_C and E3_C, it is therefore preferable to arrange the switching aid circuit 50 on the voltage side $V_{pa}$, i.e. connected to the first switching bridge 30, between the respective first midpoints 38. This arrangement of the switching aid circuit 50 on the voltage $V_{pa}$ side is preferable except in the case where the switching aid circuit 50 is in the form of the inductor 70 and the diode 72 connected in series, where the arrangement on the voltage $V_{pb}$ side (i.e. connected to the second switching bridge 40, between the respective second midpoints 48) is still preferable so that the DC component, if any, does not turn the diode 72 to the on state.

For the first step-up configuration E1_C, between the times $t_3$ and T (or $t_0$), according to the embodiment of the switching aid circuit 50, the inductor 70 or the additional piezoelectric element 76 sees its current $I_{CALC}$ increase, under the voltage $V_{pa}$ equal to $+V_{in}$. At time T (or $t_0$), the current $I_{CALC}$ is positive.

Just before time $t_0$, the total piezoelectric voltage $V_p$ is equal to $V_{in}-V_{out}$, the voltage $V_{pa}$ being equal to $V_{in}$, and the voltage $V_{pb}$ being equal to $-V_{out}$; and the switches $K_6$, $K_7$, $K_2$, $K_3$ are closed.

At time $t_0$, all switches that were closed open. The current $I_{CALC}$ then charges the parasitic capacitances of switches $K_6$, $K_7$, while discharging the parasitic capacitances of switches $K_5$ and $K_8$. Similarly, through the slowly evolving piezoelectric assemblies 12A, 12B, the current $I_{CALC}$ partially charges the parasitic capacitances of switches $K_2$, $K_3$, while partially discharging the parasitic capacitances of switches $K_1$, $K_4$. The voltage $V_{pa}$ thus changes from $+V_{in}$ to $-V_{in}$, while the voltage $V_{pb}$ changes substantially from $-V_{out}$ to $-V_{out}+2V_{in}$ plus the change of the total piezoelectric voltage $V_p$ since time $t_0$.

The voltage inversion $V_{pa}$ is considered completed before the total piezoelectric voltage $V_p$ reaches the next step $V_b$. Indeed, even if the amplitude of the current $I_{CALC}$ in the switching aid circuit 50 is much smaller than the amplitude of the internal current $I_L$ of the piezoelectric elements 15 (for example at least 3 times smaller to limit its size), it nevertheless only has to charge/discharge the parasitic capacitances of the switches 36, 46 considered much smaller than the reference capacitance $C_0$ of the piezoelectric elements 15 (at least a factor of 3). Furthermore, the current $I_{CALC}$ in the switching aid circuit 50 approaches its maximum value at time $t_0$, while the internal current $I_L$ approaches 0 at said time $t_0$.

Once complete reversal of the voltage $V_{pa}$ is reached (from $V_{in}$ to $-V_{in}$), then switches $K_5$ and $K_8$ are closed so that the voltage $V_{pa}$ is fixed, while the voltage $V_{pb}$ continues to rise to $V_{out}$ due to the natural increase in the total piezoelectric voltage $V_p$.

At time $t_1$, switches $K_1$ and $K_4$ are closed. Switches $K_5$ and $K_8$ are also closed if this has not been done already, i.e. if the voltage $V_{pa}$ has not yet reached $-V_{in}$.

In addition, if the switches $K_1$ and $K_4$ have an intrinsic reverse diode or an additional diode in parallel, they can be switched on naturally according to the sign of the internal current $I_L$ after the time $t_0$.

The remainder of the conversion cycle of the converter 10 according to this complementary aspect remains substantially unchanged from the conversion cycle of the converter 10 of FIG. 1.

The voltage swing of the total piezoelectric voltage $V_p$ is thus limited between the times $t_5$ and $t_1$, ranging from $V_{in}-V_{out}$ to $V_{out}-V_{in}$, instead of from $-V_{in}-V_{out}$ to $V_{out}-V_{in}$ with the converter 10 of FIG. 1 (in the case of the step-down configuration E2 to ensure zero-voltage switching of switches 36, 46), i.e. a swing of $2V_{out}-2V_{in}$ instead of $2V_{out}$, while ensuring zero-voltage switching of switches 36, 46.

For the second step-up configuration E3_C, between the times $t_3$ and T (or $t_0$), according to the embodiment of the switching aid circuit 50, the inductor 70 or the additional piezoelectric element 76 sees its current $I_{CALC}$ decrease, under the voltage $V_{pa}$ equal to $-V_{in}$. At time T (or $t_0$), the current $I_{CALC}$ is negative.

Just before time $t_0$, the total piezoelectric voltage $V_p$ is equal to $-V_{in}+V_{out}$, the voltage $V_{pa}$ being equal to $-V_{in}$, and the voltage $V_{pb}$ being equal to $+V_{out}$; and the switches $K_5$, $K_8$, $K_1$, $K_4$ are closed.

At time $t_0$, all switches that were closed open. The current $I_{CALC}$ then charges the parasitic capacitances of switches $K_5$, $K_8$, while discharging the parasitic capacitances of switches $K_6$ and $K_7$. Similarly, through the slowly evolving piezoelectric assemblies 12, the current $I_{CALC}$ partially charges the parasitic capacitances of switches $K_1$, $K_4$, while partially discharging the parasitic capacitances of switches $K_2$, $K_3$. The voltage $V_{pa}$ thus changes from $-V_{in}$ to $+V_{in}$, while the voltage $V_{pb}$ changes substantially from $V_{out}$ to $V_{out}-2V_{in}$ plus the change of the total piezoelectric voltage $V_p$ since time $t_0$.

The voltage inversion $V_{pa}$ is considered completed before the total piezoelectric voltage $V_p$ reaches the next step $V_b$. Indeed, even if the amplitude of the current $I_{CALC}$ in the switching aid circuit 50 is much smaller than the amplitude of the internal current $I_L$ of the piezoelectric elements 15 (for example at least 3 times smaller to limit its size), it nevertheless only has to charge/discharge the parasitic capacitances of the switches 36, 46 considered much smaller than the reference capacitance $C_0$ of the piezoelectric elements 15 (at least a factor of 3). Furthermore, the current $I_{CALC}$ in the switching aid circuit 50 approaches its maximum value (its negative extreme) at time $t_0$, while the internal current $I_L$ approaches 0 at said time $t_0$.

Once complete reversal of the voltage $V_{pa}$ is reached (from $-V_{in}$ to $+V_{in}$), then switches $K_6$ and $K_7$ are closed so that the voltage $V_{pa}$ is fixed, while the voltage $V_{pb}$ continues to rise to $-V_{out}$ due to the natural decrease in the total piezoelectric voltage $V_p$.

At time $t_1$, switches $K_2$ and $K_3$ are closed. Switches $K_6$ and $K_7$ are also closed if this has not been done already, i.e. if the voltage $V_{pa}$ has not yet reached $+V_{in}$.

In addition, if the switches $K_2$ and $K_3$ have an intrinsic reverse diode or an additional diode in parallel, they can be switched on naturally according to the sign of the internal current $I_L$ after the time $t_0$.

The remainder of the conversion cycle of the converter 10 according to this complementary aspect remains substantially unchanged from the conversion cycle of the converter 10 of FIG. 1.

Once again, the voltage swing of the total piezoelectric voltage $V_p$ is thus limited between the times $t_5$ and $t_1$, ranging from $V_{out}-V_{in}$ to $V_{in}-V_{out}$, instead of from $+V_{in}+V_{out}$ to $V_{in}-V_{out}$ with the converter 10 of FIG. 1 (in the case of the step-up configuration E4 to ensure zero-voltage switching of switches 36, 46), i.e. a swing of $2V_{out}-2V_{in}$ instead of $2V_{out}$, while ensuring zero-voltage switching of switches 36, 46.

As an optional addition, when the converter 10 comprises two switching aid circuits 50, with the first switching aid circuit connected to the first switching bridge 30 and the second switching aid circuit connected to the second switching bridge 40, then the switching aid circuits 50 being arranged on both the voltage $V_{pa}$ side and the voltage $V_{pb}$ side, the effects of the two switching aid circuits 50 add up. The only thing to do is to choose the switching aid circuit 50 according to the presence or absence of a DC component, and possibly according to the sign of this DC component if there is one.

Alternatively, switches $K_1$, $K_2$, $K_3$ and $K_4$ are single diodes, and switches $K_5$, $K_6$, $K_7$ and $K_8$ are fixed-direction voltage switches.

It is thus conceivable that the electrical energy converter 10 according to this additional aspect offers further improved control through the switching aid circuit 50.

The invention claimed is:

1. An electronic control device for controlling an electrical energy converter capable of converting an input voltage into at least one output voltage, the converter comprising a first switching bridge comprising two first switching branches, each first switching branch being connected between two terminals for applying the input voltage and comprising at least two first switches connected in series and linked together at a first midpoint; at least one second switching bridge comprising two second switching branches, each second switching branch being connected between two terminals for supplying the output voltage and comprising at least two second switches connected in series and linked together at a second midpoint; at least a pair of first and second piezoelectric assemblies, each piezoelectric assembly comprising at least one piezoelectric element and being connected between respective first and second midpoints, the midpoints between which the piezoelectric assemblies are connected being distinct from one piezoelectric assembly to the other;

the electronic control device is configured to command, during a respective resonance cycle of the piezoelectric assemblies, a switching of each of the switches to alternate phases at substantially constant voltage across the piezoelectric assemblies and phases at substantially constant load across said piezoelectric assemblies, wherein the electronic control device is configured so as, during each phase at substantially constant load, to command into the closed position at the same time at most one respective one of the switches connected directly to the first piezoelectric assembly and at most one respective one of the switches connected directly to the second piezoelectric assembly, and to command into the open position all the other switches of the first and second switching branches.

2. The device according to claim 1, wherein the value of the voltage of each of the phases at substantially constant voltage is distinct from zero.

3. The device according to claim 2, wherein the value of the voltage of each of the phases at substantially constant voltage is selected from the group consisting of: difference between the value of the input voltage and that of the output voltage; difference between the value of the output voltage and that of the input voltage; sum of the values of the input and output voltages; and opposite of the sum of the values of the input and output voltages.

4. The device according to claim 1, wherein the number of phases at substantially constant voltage during a respective resonance cycle is greater than or equal to 3.

5. The device according to claim 4, wherein the number of phases at substantially constant voltage during a respective resonance cycle is equal to 3.

6. An electronic power conversion system comprising:

an electrical energy converter capable of converting an input voltage into at least one output voltage, and comprising:

a first switching bridge comprising two first switching branches, each first switching branch being connected between two terminals for applying the input voltage and comprising at least two first switches connected in series and linked together at a first midpoint;

at least one second switching bridge with two second switching branches, each second switching branch being connected between two terminals for supplying the output voltage and comprising at least two second switches connected in series and linked together at a second midpoint; and at least one pair of first and second piezoelectric assemblies, each piezoelectric assembly having at least one piezoelectric element and being connected between respective first and second midpoints, the midpoints between which the piezoelectric assemblies are connected being distinct from one piezoelectric assembly to the other; and an electronic control device for controlling the electrical energy converter;

wherein the control device is according to claim 1.

7. The system according to claim 6, wherein the electronic system for electrical energy conversion is a DC electrical energy conversion system.

8. The system according to claim 7, wherein the electronic system for electrical energy conversion is a DC-DC conversion system.

9. The system according to claim 7, wherein the electronic system for electrical energy conversion is an AC-DC conversion system.

10. The system according to claim 6, wherein the electrical energy converter is capable of converting the input voltage into a plurality of distinct output voltages, and comprises for each respective output voltage:

a respective second switching bridge, each second switching branch being connected between two respective output voltage supply terminals;

a respective pair of first and second piezoelectric assemblies.

11. The system according to claim 6, wherein each piezoelectric assembly consists of one of the group consisting of: a single piezoelectric element; a plurality of piezoelectric elements connected in series; a plurality of piezoelectric elements connected in parallel; a piezoelectric element and an auxiliary capacitor connected in series; a piezoelectric element and an auxiliary capacitor connected in parallel; and an arrangement of a plurality of parallel piezoelectric branches, each branch comprising one or more piezoelectric elements connected in series or an auxiliary capacitor.

12. The system according to claim 11, wherein the auxiliary capacitor has a capacitance greater than a reference capacitance of the piezoelectric element(s), each piezoelectric element being modelled as a capacitor and a resonant branch connected in parallel to the capacitor, the reference capacitance being the capacitance of said capacitor.

13. The system according to claim 6, wherein the converter further comprises at least one switching aid circuit, each switching aid circuit being connected to a respective one of the first and second midpoints, each switching aid circuit being configured to, via the flow of a previously received current, discharge a parasitic capacitance of a switch of the respective switching bridge to which it is connected, and respectively charge a parasitic capacitance of another switch of said switching bridge.

14. The system according to claim 13, wherein the converter comprises two switching aid circuits, a first switching aid circuit being connected to the first switching bridge and a second switching aid circuit being connected to the second switching bridge.

15. The system according to claim 13, wherein each switching aid circuit comprises an element selected from the group consisting of: an electromagnetic coil; a first set of an electromagnetic coil and a diode connected in series; a second set of an electromagnetic coil and a capacitor connected in series; and an additional piezoelectric element.

16. The system according to claim 15, wherein each switching aid circuit consists of an element selected from said group.

17. A method for controlling an electrical energy converter capable of converting an input voltage into at least one output voltage, the converter comprising a first switching bridge comprising two first switching branches, each first switching branch being connected between two terminals for applying the input voltage and comprising at least two first switches connected in series and linked together at a first midpoint; at least one second switching bridge comprising two second switching branches, each second switching branch being connected between two terminals for supplying the output voltage and comprising at least two second switches connected in series and linked together at a second midpoint; at least a pair of first and second piezoelectric assemblies, each piezoelectric assembly comprising at least one piezoelectric element and being connected between respective first and second midpoints, the midpoints between which the piezoelectric assemblies are connected being distinct from one piezoelectric assembly to the other;

the method being implemented by an electronic control device and comprising the commanding, during a respective resonance cycle of the piezoelectric assemblies, of a switching of each of the switches to alternate phases at substantially constant voltage across the piezoelectric assemblies and phases at substantially constant load across said piezoelectric assemblies, wherein, during each phase at substantially constant load, at most one respective switch among the switches directly connected to the first piezoelectric assembly and at most one respective switch among the switches directly connected to the second piezoelectric assembly are in the closed position at the same time, with all the other switches of the first and second switching branches being commanded in the open position.

\* \* \* \* \*